(12) United States Patent
Shen et al.

(10) Patent No.: US 11,950,450 B2
(45) Date of Patent: Apr. 2, 2024

(54) DISPLAY SUBSTRATE AND METHOD OF MANUFACTURING THE SAME AND ELECTRONIC DEVICE

(71) Applicant: BOE TECHNOLOGY GROUP CO., LTD, Beijing (CN)

(72) Inventors: Xiaobin Shen, Beijing (CN); Yu Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 93 days.

(21) Appl. No.: 16/959,261

(22) PCT Filed: Aug. 27, 2019

(86) PCT No.: PCT/CN2019/102890
§ 371 (c)(1),
(2) Date: Jun. 30, 2020

(87) PCT Pub. No.: WO2021/035549
PCT Pub. Date: Mar. 4, 2021

(65) Prior Publication Data
US 2021/0408493 A1 Dec. 30, 2021

(51) Int. Cl.
*H10K 50/858* (2023.01)
*H10K 50/844* (2023.01)
(Continued)

(52) U.S. Cl.
CPC ......... *H10K 50/858* (2023.02); *H10K 50/844* (2023.02); *H10K 59/1315* (2023.02);
(Continued)

(58) Field of Classification Search
CPC ... H01L 51/5275; H01L 51/5253–5256; H01L 51/56; H01L 27/322;
(Continued)

(56) References Cited

U.S. PATENT DOCUMENTS

| | | | |
|---|---|---|---|
| 9,659,528 B2 | 5/2017 | Kim | |
| 2008/0191603 A1* | 8/2008 | Kubota | H01L 51/5228 313/498 |

(Continued)

FOREIGN PATENT DOCUMENTS

| | | |
|---|---|---|
| CN | 102208434 A | 10/2011 |
| CN | 104751786 A | 7/2015 |

(Continued)

OTHER PUBLICATIONS

Search report issued for European Application No. 19933205.7, dated Aug. 16, 2022, 12 pages.

*Primary Examiner* — Shaun M Campbell
(74) *Attorney, Agent, or Firm* — Raj S. Dave; Dave Law Group LLC

(57) ABSTRACT

A display substrate and a method of manufacturing the same and an electronic device. The display substrate is defined to be an array area and a peripheral area surrounding the array area. The array area includes a plurality of light emitting subunits. Each of the plurality of light emitting subunits includes: a first electrode, a second electrode and a light emitting layer. The first electrodes of the plurality of light emitting subunits are electrically connected with each other. The display substrate further includes a light extraction layer. Projections of the first electrodes of the plurality of light emitting subunits and a projection of the connecting electrode on the base substrate are within a projection of the light extraction layer on the base substrate.

19 Claims, 11 Drawing Sheets

(51) Int. Cl.
  *H10K 59/12* (2023.01)
  *H10K 59/131* (2023.01)
  *H10K 59/38* (2023.01)
  *H10K 71/00* (2023.01)
(52) U.S. Cl.
  CPC .............. *H10K 59/38* (2023.02); *H10K 71/00* (2023.02); *H10K 59/1201* (2023.02)
(58) Field of Classification Search
  CPC .......... H01L 27/3279; H01L 2227/323; H10K 50/858; H10K 50/844; H10K 71/00; H10K 59/38; H10K 59/1315; H10K 59/1201
  See application file for complete search history.

(56) References Cited

U.S. PATENT DOCUMENTS

| | | |
|---|---|---|
| 2009/0200937 A1 | 8/2009 | Sawaga et al. |
| 2016/0043340 A1* | 2/2016 | Ohara ................. H01L 51/5253 438/26 |
| 2016/0064467 A1 | 3/2016 | Ota et al. |
| 2018/0082630 A1* | 3/2018 | Kim ......................... G09G 3/22 |
| 2018/0090061 A1 | 3/2018 | Kim et al. |
| 2018/0166525 A1* | 6/2018 | Kim ......................... G01N 27/20 |
| 2019/0067409 A1* | 2/2019 | Shin .................... H01L 51/5253 |
| 2019/0164487 A1* | 5/2019 | Lee ..................... H01L 27/1218 |
| 2019/0252487 A1 | 8/2019 | Wang et al. |

FOREIGN PATENT DOCUMENTS

| | | | |
|---|---|---|---|
| CN | 107871767 A | 4/2018 | |
| CN | 108305890 A | 7/2018 | |
| CN | 109427845 A | 3/2019 | |
| EP | 2019432 A2 | 1/2009 | |
| EP | 2562742 A2 | 2/2013 | |
| EP | 3229287 A1 | 10/2017 | |
| EP | 3522229 A1 | 8/2019 | |
| JP | 2007157470 A | 6/2007 | |
| KR | 20170113764 | * 10/2017 | ............. H01L 51/00 |

* cited by examiner

200 disposing a plurality of light emitting subunits in the array area on a surface of the base substrate, wherein each of the plurality of light emitting subunits includes: a first electrode, a second electrode and a light emitting layer which are laminated on a surface of the base substrate; the light emitting layer is between the first electrode and the second electrode; the first electrode is farther away from the base substrate than the light emitting layer; and the first electrodes of the plurality of light emitting subunits are electrically connected with each other ⎯ S202 disposing a connecting electrode surrounding the array area in the peripheral area on the surface of the base substrate, wherein the connecting electrode is electrically connected with the first electrode ⎯ S204 disposing a light extraction layer on a side of the first electrode and the connecting electrode away from the base substrate, so that projections of the first electrode and the connecting electrode on the base substrate are within a projection of the light extraction layer on the base substrate in at least one direction parallel to the surface ⎯ S206

Fig. 17

DISPLAY SUBSTRATE AND METHOD OF MANUFACTURING THE SAME AND ELECTRONIC DEVICE

CROSS-REFERENCE TO RELATE APPLICATIONS

This application is the National Stage Entry of PCT/CN2019/102890 file on Aug. 27, 2019, the entire disclosure of which is incorporated herein by reference as part of the disclosure of the application.

TECHNICAL FIELD

The embodiments of the present disclosure relate to a display substrate and a method of manufacturing the same and an electronic device.

BACKGROUND

Due to the advantages of self-luminescence, low power consumption, a fast response speed, flexibility, high contrast, a large viewing angle, ultra-thin and light and low cost, organic electroluminescent devices are favored by people. The organic electroluminescent device includes an anode, a cathode, and an organic light-emitting layer disposed therebetween. Holes injected from the anode and electrons injected from the cathode combine in the organic light-emitting layer to form excitons, and the organic electroluminescent device emits light when the excitons fall from the excited state to the ground state.

SUMMARY

At least one embodiment of the present disclosure provides a display substrate, wherein the display substrate is defined to be an array area and a peripheral area surrounding the array area;
the display substrate comprises a base substrate;
the array area comprises a plurality of light emitting subunits; each of the plurality of light emitting subunits comprises: a first electrode, a second electrode and a light emitting layer which are laminated on a surface of the base substrate; the light emitting layer is between the first electrode and the second electrode; the first electrode is farther away from the base substrate than the light emitting layer; the first electrodes of the plurality of light emitting subunits are electrically connected with each other;
the peripheral area comprises a connecting electrode, the connecting electrode is on the surface of the base substrate and at least partially surrounds the array area; the connecting electrode is electrically connected with the first electrodes of the plurality of light emitting subunits; and
the display substrate further comprises a light extraction layer on a side of the first electrode and the connecting electrode away from the base substrate; and projections of the first electrodes of the plurality of light emitting subunits and a projection of the connecting electrode on the base substrate are within a projection of the light extraction layer on the base substrate in at least one direction parallel to the surface.

For example, in the display substrate according to at least one embodiment of the present disclosure, the connecting electrode comprises:
a first conductive sublayer; and
a second conductive sublayer, the second conductive sublayer is on a side of the first conductive sublayer away from the base substrate, is at least partially overlapped with the first conductive sublayer in a direction perpendicular to the surface of the base substrate, and is electrically connected with the first conductive sublayer and the first electrode.

For example, in the display substrate according to at least one embodiment of the present disclosure, the first conductive sublayer is in direct contact with the second conductive sublayer.

For example, in the display substrate according to at least one embodiment of the present disclosure, the first conductive sublayer and the second electrode are in a same conductive layer, comprise a same material, and are insulated from each other.

For example, in the display substrate according to at least one embodiment of the present disclosure, the second conductive sublayer and the first electrode are in a same conductive layer and comprise a same material.

For example, in the display substrate according to at least one embodiment of the present disclosure, the first electrodes of the plurality of light emitting subunits are integrally connected and server as at least a part of a first common electrode layer.

For example, in the display substrate according to at least one embodiment of the present disclosure, the second conductive sublayer and the first common electrode layer are integrally connected.

For example, in the display substrate according to at least one embodiment of the present disclosure, each of the second conductive sublayer and the first electrode comprises a first sublayer and a second sublayer which are laminated,
the first sublayer comprises aluminum magnesium alloy,
the second sublayer comprises indium zinc oxide; and
the second sublayer is on a side of the first sublayer away from the base substrate.

For example, in the display substrate according to at least one embodiment of the present disclosure, the peripheral area further comprises a first dummy electrode;
the first dummy electrode is on the surface of the base substrate and at least partially surrounds the connecting electrode; and the connecting electrode is between the first dummy electrode and the array area.

For example, in the display substrate according to at least one embodiment of the present disclosure, a projection of the light extraction layer on the base substrate is at least partially overlapped with a projection of the first dummy electrode on the base substrate.

For example, in the display substrate according to at least one embodiment of the present disclosure, a projection of the light extraction layer on the base substrate is not overlapped with a projection of the first dummy electrode on the base substrate.

For example, in the display substrate according to at least one embodiment of the present disclosure, the display substrate further comprises a first insulating layer and an intermediate conductive layer,
the first insulating layer is on a side of the second electrode away from the first electrode and comprises a first via hole and a second via hole;

the intermediate conductive layer is on a side of the first insulating layer away from the second electrode and comprises a first conductive part and a second conductive part; and the second electrode is electrically connected with the first conductive part through the first via hole; and the first electrode is electrically connected with the second conductive part through the connecting electrode and the second via hole.

For example, in the display substrate according to at least one embodiment of the present disclosure, the base substrate comprises a first circuit and a second circuit;

the display substrate further comprises a second insulating layer on a side of the intermediate conductive layer away from the second electrode;

the second insulating layer is between the intermediate conductive layer and the base substrate;

the second insulating layer comprises a third via hole and a fourth via hole;

the second electrode is electrically connected with the first circuit of the base substrate through the first via hole, the first conductive part and the third via hole; and the first electrode is electrically connected with the second circuit of the base substrate through the connecting electrode, the second via hole, the second conductive part and the fourth via hole.

For example, in the display substrate according to at least one embodiment of the present disclosure, the first via hole, the second via hole, the third via hole and the fourth via hole are filled with a conductive material.

For example, in the display substrate according to at least one embodiment of the present disclosure, the peripheral area further comprises a second dummy electrode;

the second dummy electrode is on the surface of the base substrate and at least partially surrounds the array area; and the second dummy electrode is between the connecting electrode and the array area.

For example, in the display substrate according to at least one embodiment of the present disclosure, the first electrode and the light emitting layer of the light emitting subunit adjacent to the second dummy electrode extend to be at least partially overlapped with the second dummy electrode in the direction perpendicular to the surface of the base substrate; and the second conductive sublayer extend to be at least partially overlapped with the second dummy electrode in the direction perpendicular to the surface of the base substrate.

For example, in the display substrate according to at least one embodiment of the present disclosure, the peripheral area further comprises a sensor electrode; and the sensor electrode is between the second dummy electrode and the array area on the surface of the base substrate.

For example, in the display substrate according to at least one embodiment of the present disclosure, the first electrode and the light emitting layer of the light emitting subunit adjacent to the second dummy electrode extend to completely cover the sensor electrode in the direction perpendicular to the surface of the base substrate.

For example, in the display substrate according to at least one embodiment of the present disclosure, the base substrate comprises a third circuit;

the intermediate conductive layer further comprises a third conductive part; the first insulating layer further comprises a fifth via hole; the second insulating layer further comprises a sixth via hole; and the sensor electrode is electrically connected with the third conductive part through the fourth via hole, and is electrically connected with the third circuit of the base substrate through the fourth via hole, the third conductive part and the fifth via hole.

For example, in the display substrate according to at least one embodiment of the present disclosure, the fifth via hole and the sixth via hole are filled with a conductive material.

For example, in the display substrate according to at least one embodiment of the present disclosure, the peripheral area further comprises a third dummy electrode;

the third dummy electrode is on the surface of the base substrate and at least partially surrounds the array area; and the third dummy electrode is between the sensor electrode and the array area.

For example, in the display substrate according to at least one embodiment of the present disclosure, the first electrode and the light emitting layer of the light emitting subunit adjacent to the second dummy electrode extend to completely cover the third dummy electrode in the direction perpendicular to the surface of the base substrate.

For example, the display substrate according to at least one embodiment of the present disclosure further comprises a pixel define layer, wherein the pixel define layer is at at least one of following positions:

between the second electrodes of adjacent light emitting subunits;

between the connecting electrode and the first dummy electrode;

between the connecting electrode and the second dummy electrode;

between the second dummy electrode and the sensor electrode;

between the sensor electrode and the third dummy electrode;

between the third dummy electrode and the second electrode of the light emitting subunit adjacent to the third dummy electrode; and between the second dummy electrode and the light emitting layer of the light emitting subunit adjacent to the second dummy electrode.

For example, in the display substrate according to at least one embodiment of the present disclosure, the first conductive sublayer of the connecting electrode, the first dummy electrode, the second dummy electrode, the sensor electrode, the third dummy electrode, and the second electrode of the light emitting subunit are in a same conductive layer.

For example, in the display substrate according to at least one embodiment of the present disclosure, the first dummy electrode, the second dummy electrode and the third dummy electrode are in a floating state.

For example, in the display substrate according to at least one embodiment of the present disclosure, the display substrate further comprises a first encapsulation layer on a side of the light extraction layer away from the base substrate.

For example, in the display substrate according to at least one embodiment of the present disclosure, the display substrate further comprises a color filter layer, the color filter layer is on a side of the first encapsulation layer away from the base substrate.

For example, in the display substrate according to at least one embodiment of the present disclosure, the color filter layer comprises: a first color filter part; and the first color filter part is in the array area and is overlapped with at least one light emitting subunit in the direction perpendicular to the surface of the base substrate.

For example, in the display substrate according to at least one embodiment of the present disclosure, the color filter layer further comprises: a second color filter part; and
the second color filter part is in the peripheral area and is overlapped with at least one of following elements in the direction perpendicular to the surface of the base substrate:
the connecting electrode;
the first dummy electrode;
the second dummy electrode;
the sensor electrode; and
the third dummy electrode.

For example, in the display substrate according to at least one embodiment of the present disclosure, the display substrate further comprises a second encapsulation layer, the second encapsulation layer is on a side of the color filter layer away from the base substrate.

For example, in the display substrate according to at least one embodiment of the present disclosure, a projection of the first encapsulation layer on the base substrate is within a projection of the second encapsulation layer on the base substrate.

For example, in the display substrate according to at least one embodiment of the present disclosure, an area of the projection of the first encapsulation layer on the base substrate is less than an area of the projection of the second encapsulation layer on the base substrate.

For example, the display substrate according to at least one embodiment of the present disclosure further comprises a cover plate,
wherein the cover plate is on a side of the second encapsulation layer of the display substrate away from the base substrate.

For example, in the display substrate according to at least one embodiment of the present disclosure, the projection of the second encapsulation layer on the base substrate is within a projection of the cover plate on the base substrate.

For example, in the display substrate according to at least one embodiment of the present disclosure, the area of the projection of the second encapsulation layer on the base substrate is less than an area of the projection of the cover plate on the base substrate.

For example, in the display substrate according to at least one embodiment of the present disclosure, the second electrode is a reflecting electrode.

For example, in the display substrate according to at least one embodiment of the present disclosure, the base substrate is a silicon-base substrate; and the silicon-base substrate comprises a driving circuit configured to drive the plurality of light emitting subunits.

At least one embodiment of the present disclosure further provides an electronic device, which includes the display substrate according to any one of the embodiments of the present disclosure.

At least one embodiment of the present disclosure further provides a method of manufacturing a display substrate, wherein the display substrate is defined to be an array area and a peripheral area surrounding the array area; the display substrate comprises a base substrate; and the method comprises:
disposing a plurality of light emitting subunits in the array area on a surface of the base substrate, wherein each of the plurality of light emitting subunits comprises: a first electrode, a second electrode and a light emitting layer which are laminated on the surface of the base substrate; the light emitting layer is between the first electrode and the second electrode; the first electrode is farther away from the base substrate than the light emitting layer; the first electrodes of the plurality of light emitting subunits are electrically connected with each other;
disposing a connecting electrode in the peripheral area on the surface of the base substrate surrounding the array area, the connecting electrode being electrically connected with the first electrode; and
disposing a light extraction layer on a side of the first electrode and the connecting electrode away from the base substrate, so that projections of the first electrode and the connecting electrode on the base substrate are within a projection of the light extraction layer on the base substrate in at least one direction parallel to the surface.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

FIG. 17 is a schematic flow chart of a method of manufacturing a display substrate provided by at least one embodiment of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At present, due to the presence of a metal cathode, the loss of external optical coupling efficiency of a top-emission device is mainly caused by the surface plasma polariton and the waveguide mode. The waveguide mode is mainly due to total reflection between a metal electrode and an organic layer, resulting in light being confined in the organic layer and consumed. In addition, the organic electroluminescent device may also include an optical microcavity to narrow the half-height width of an emission spectrum through the microcavity effect. However, the microcavity effect increases the probability of the waveguide effect.

At least one embodiment of the present disclosure provides a display substrate, which can improve the light exiting ratio and improve the encapsulation effect of the display substrate.

Figure 1:
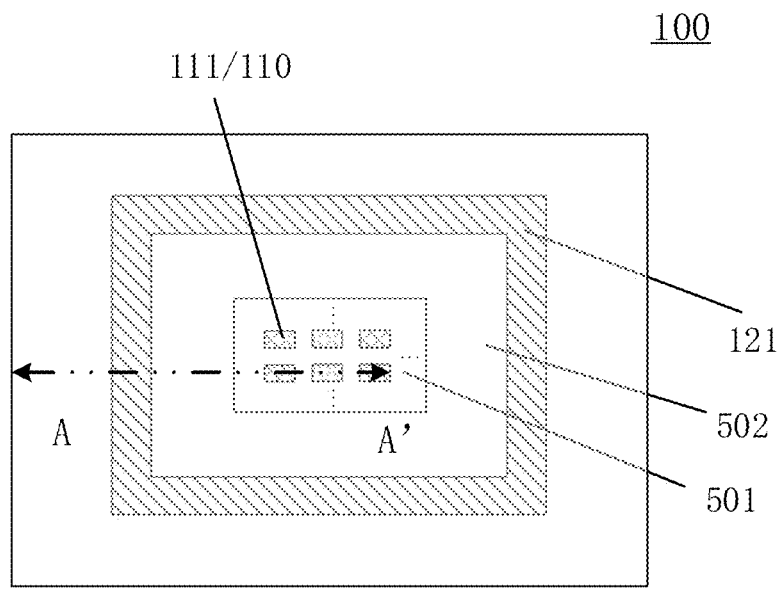
FIG. 1 is a schematic plan view of a display substrate provided by at least one embodiment of the present disclosure.
Figure 2:
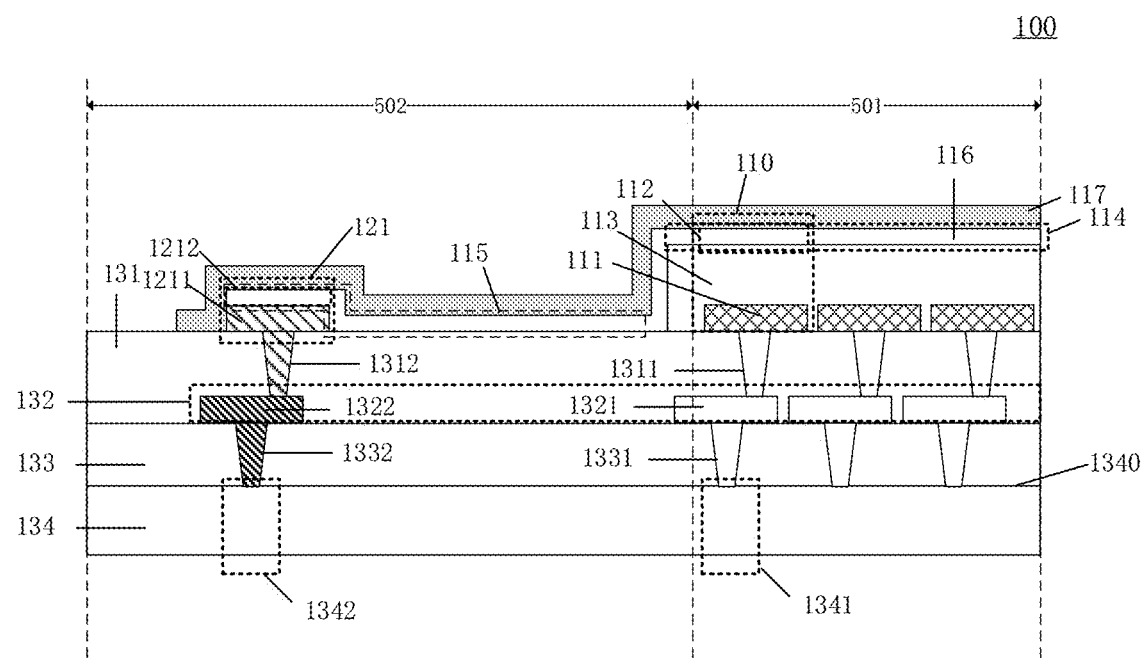
FIG. 2 is a cross-sectional view along line AA' in FIG. 1.

FIG. 1 is a schematic plan view of a display substrate provided by at least one embodiment of the present disclosure, and FIG. 2 is a cross-sectional view along line AA' in FIG. 1. As shown in FIG. 1, a display substrate 100 provided by at least one embodiment of the present disclosure is defined to be an array area 501 and a peripheral area 502 surrounding the array area 501. The array area 501 includes a plurality of light emitting subunits 110. The peripheral area 502, for instance, may include a conductive ring 121 (such as a cathode ring) disposed around the array area 501.

The specific structure of the display substrate 100 provided by at least one embodiment of the present disclosure will be described below with reference to FIG. 2. As shown in FIG. 2, the display substrate 100 comprises a base substrate 134. The base substrate 134 may support and protect layers or elements formed thereon. The base substrate 134 may be made from a rigid material(s) or a flexible material(s). For instance, the base substrate 134 may be made from glass, ceramic, silicon, polyimide (PI), etc. The base substrate 134 may comprise a pixel circuit, a gate drive circuit, a data drive circuit and the like (the detailed structure of the base substrate 134 is not shown in FIG. 1) used for driving the light emitting subunits 110. The pixel circuit may adopt the typical 2T1C or 4T1C pixel circuit and may also be a pixel circuit having functions such as internal compensation or external compensation. No limitation will be given here in the embodiment of the present disclosure. For instance, the gate drive circuit (not shown in the figure) is configured to generate gate drive signals, and the data drive signal (not shown in the figure) is configured to generate data signals. The gate drive circuit and the data drive circuit may adopt the conventional circuit structure in the art. No limitation will be given here in the embodiment of the present disclosure.

When the base substrate 134 is a silicon substrate (for instance, a monocrystalline silicon bulk silicon substrate or a silicon-on-insulator (SOI) substrate), the pixel circuit, the gate drive circuit, the data drive circuit and the like used for driving the light emitting subunits 110 may be formed on the base substrate by semiconductor processes (including but not limited to ion injection, thermal oxidation, physical vapor deposition (PVD), a grinding process, a via process, etc.). These circuit structures include metal-oxide-semiconductor (MOS) transistors. Other peripheral circuit structures, for example, bonding structures and the like, may also be formed on the base substrate 134. No limitation will be given here in the embodiment of the present disclosure.

Each light emitting subunit 110 includes: a first electrode 112, a second electrode 111 and a light emitting layer 113 which are laminated on a surface 1340 of the base substrate 134. For instance, the first electrode 112 and the second electrode 111 are configured to apply the light emitting driving voltage (applying the light emitting driving voltage to the light emitting layer 113), so that the light emitting layer 113 emits light, and the light intensity corresponds to the value of the light emitting driving voltage. For instance, the light emitting driving voltage is the difference between the voltage of the first electrode 112 and the voltage of the second electrode 111.

The light emitting layer 113 is disposed between the first electrode 112 and the second electrode 111. The first electrode 112 is farther away from the base substrate 134 than the light emitting layer 113. In some embodiments, the first electrodes 112 of different light emitting subunits 110 may be arranged in the same structural layer and electrically connected with each other. For instance, as shown in FIG. 2, the first electrodes 112 of the plurality of light emitting subunits 110 may be integrally connected and taken as at least one part of a first common electrode layer 114. Description of the embodiments of the present disclosure will be given below by taking the case that the first electrodes 112 of the plurality of light emitting subunits 110 are integrally connected and taken as at least one part of the first common electrode layer 114 as an example. However, no limitation will be given here in the embodiment of the present disclosure.

The light emitting subunit 110 may be an element that emits, for instance, red light, blue light, green light or white light. When the light emitting subunit 110 is a light emitting element that emits white light, a color filter may also be disposed in the light-emitting direction of the display substrate 100, so as to convert white light into colored light, thereby realizing a color display device.

The light emitting subunit 110 may realize the emission of white light by multiple methods, for instance, adopting a multi-light emitting layer structure (for example, a structure in which red, green and blue light emitting sublayers are stacked), or adopting a multi-doped light emitting layer structure (for example, dopants for emitting light of different colors are doped into the same main light emitting layer). No limitation will be given here in the embodiment of the present disclosure.

Description of the embodiments of the present disclosure is given by taking atop-emission light emitting subunit 110 as an example, that is, light generated by the light emitting subunit 110 is emitted from the display substrate 100 along a direction away from the base substrate 134. However, no limitation will be given here in the embodiment of the present disclosure.

The first electrode 112 is at least partially transparent, and the second electrode 111 may be a reflecting electrode. In some embodiments, the first electrode 112 may be a cathode, and the second electrode 111 may be an anode. However, it should be understood that no limitation will be given here in the embodiment of the present disclosure.

In some embodiments, the light emitting layers 113 of different light emitting subunits 110 are integrally formed. For instance, the light emitting layers 113 of different light emitting subunits 110 are arranged in the same structural layer and connected with each other. For instance, the light emitting layers 113 of different light emitting subunits 110 are made from the same material and emit light of the same color (such as white light or blue light). In some other embodiments, the light emitting layers 113 of different light emitting subunits 110 (for example, different light emitting subunits 110 arranged in the same pixel) are made from different materials and configured to emit light of different colors. No limitation will be given here in the embodiment of the present disclosure.

In some embodiments, the light emitting subunit 110 may also include at least one of a hole injection layer (HIL), a hole transport layer (HTL), an electron injection layer (EIL) or an electron transport layer (ETL). At least one of the HIL and the HTL may be further disposed between the anode and an organic light-emitting layer, and at least one of the ETL or the EIL may be disposed between the organic light-emitting layer and the cathode. The organic light-emitting layer, the HIL, the HTL, the ETL and the EIL may include organic materials and then may be collectively called organic layer or organic functional layer.

The peripheral area 502 includes a connecting electrode 121. The connecting electrode 121 is arranged on the surface 1340 of the base substrate 134 and at least partially surrounds the array area 501. Moreover, the connecting electrode 121 is electrically connected with the first electrode 112.

In some embodiments, the connecting electrode 121 may include: a first conductive sublayer 1211 and a second conductive sublayer 1212. The second conductive sublayer 1212 is disposed on a side of the first conductive sublayer 1211 away from the base substrate 134 and is at least partially overlapped with the first conductive sublayer 1211 in a direction perpendicular to the surface 1340 of the base substrate 134. Moreover, the second conductive sublayer 1212 is electrically connected with both the first conductive sublayer 1211 and the first electrode 112. In some embodiments, the second conductive sublayer 1212 may be extended to other areas covering the peripheral area 502 to form a second common electrode layer 115. That is to say, the part of the second common electrode layer 115 overlapping with the first conductive sublayer 1211 is the second conductive sublayer 1212.

The first conductive sublayer 1211 and the second conductive sublayer 1212 may directly contact each other, that is, there is no intervening layer or element between the first conductive sublayer 1211 and the second conductive sublayer 1212.

Figure 3:
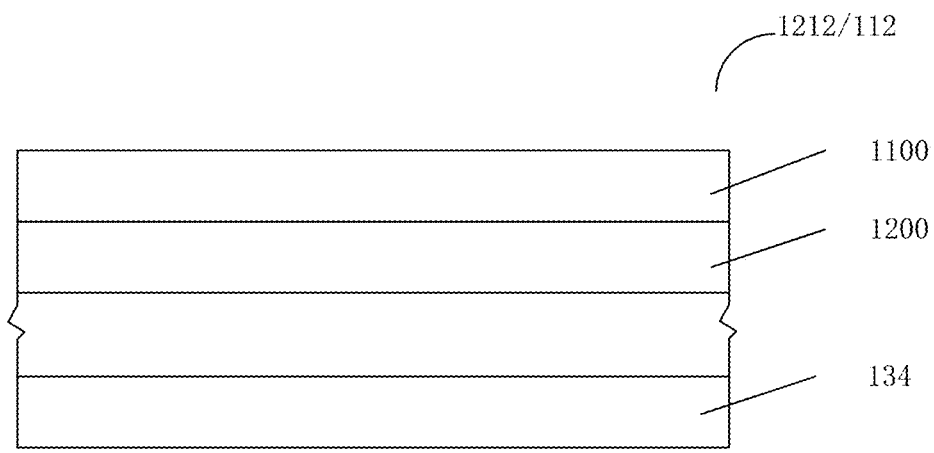
FIG. 3 is a schematic structural view of a first electrode and a second conductive sublayer provided by at least one embodiment of the present disclosure.

The second conductive sublayer 1212 and the first electrode 112 may be formed in the same conductive layer and include the same material. For instance, as shown in FIG. 3, in some embodiments, both the second conductive sublayer 1212 and the first electrode 112 may include a first sublayer 1200 and a second sublayer 110 which are laminated. Moreover, the second sublayer 1100 is disposed on a side of the first sublayer 1200 away from the base substrate 134. For instance, the first sublayer 1200 includes aluminum-magnesium alloy, and the second sublayer 110 includes indium zinc oxide.

For instance, the second electrode 111 and the first conductive sublayer 1211 are arranged in the same structural layer. For instance, the first conductive sublayer 1211 and the second electrode 111 are arranged in the same conductive layer and include the same material, and are insulated from each other. For instance, the second electrode 111 and the connecting electrode 121 may be obtained by patterning the same conductive layer (such as a single conductive layer) by the same patterning process.

For instance, the connecting electrode 121 may have a ring structure, and the distances from the connecting electrode 121 to edges of the array area 501 are substantially the same. It should be understood that in some embodiments, the connecting electrode 121 may include at least one ring-shaped subelectrode which is arranged around the array area and spaced from each other.

For instance, the electrical connection performance of the common electrode layer 116 (for example, a cathode layer, detailed description will be given below) and the base substrate 134 can be improved by the connecting electrode 121 (e.g., the cathode ring). For instance, when the connecting electrode 121 may adopt metallic materials (such as aluminum, aluminum alloy, copper or copper alloy), the resistance of the path that provides the supply voltage for the first electrode 112 can be reduced, thereby reducing the power consumption of the display substrate and improving the light emitting efficiency of the display substrate.

For instance, as shown in FIG. 2, in some embodiments, the second conductive sublayer 1212 of the connecting electrode 121 and the first common electrode layer 114 may be integrally connected. For instance, the second common electrode layer 115 and the first common electrode layer 114 are integrated to form a common electrode layer 116 (such as a cathode layer). For instance, as shown in FIG. 2, the common electrode layer 116 covers the array area 501 and the peripheral area 502 and is laminated with the first conductive sublayer 1211. As shown in FIG. 2, the common electrode layer 116 is a continuous structure. There is no interface between the second common electrode layer 115 and the first common electrode layer 114.

In addition, although a projection of the first conductive sublayer 1211 on the base substrate 134 is within a projection of the second conductive sublayer 1212 on the base substrate 134 in FIG. 2, it should be understood that the embodiment of the present disclosure is not limited thereto, as long as the first conductive sublayer 1211 and the second conductive sublayer 1212 can form an electrical connection. In some embodiments, the first conductive sublayer 1211 may be partially overlapped with the second common electrode layer 115, that is, the edge of the first conductive sublayer 1211 away from the array substrate 501 is farther away from the array area 501 than the edge of the second common electrode layer 115.

The display substrate 100 further comprises a light extraction layer 117 which is configured to extract light generated in the light emitting layer 113. Moreover, the light extraction layer 117 is disposed on a side of the first common electrode layer 114 and the second common electrode layer 115 away from the base substrate 134, that is, the light extraction layer 117 is disposed on a side of the first electrode 112 and the connecting electrode 121 away from the base substrate 134. Projections of the first electrode 112 and the connecting electrode 121 on the base substrate 134 are within a projection of the light extraction layer 117 on the base substrate 134 in at least one direction parallel to the surface 1340. For instance, the edge of the light extraction layer 117 may be farther away from the array area 501 than the edge of the connecting electrode 121 away from the array substrate 501.

When the light extraction layer 117 covers the first electrode (cathode) 112 of the light emitting subunit 110, the number of surface plasma polaritons near the first electrode 112 will be reduced, thereby reducing the energy dissipation near the first electrode 112, improving the effective transmittance of the first electrode 111, and improving the light extraction efficiency of the light emitting element.

The light extraction layer 117 may be made from organic materials such as 8-hydroxyquinoline aluminum salt (Alq3) and may also be made from inorganic materials such as titanium dioxide (TiO2), magnesium oxide (MgO), magnesium fluoride (MgF2) or silicon dioxide (SiO2), or made from other suitable materials. No limitation will be given here in the embodiment of the present disclosure. In some embodiments, the light extraction layer 117 may have a refractive index of 1.7 or greater, for example, 1.75, 2.0.

As shown in FIG. 2, in some embodiments, the display substrate 100 further comprises a first insulating layer 131, an intermediate conductive layer 132 and a second insulating layer 133. In some other embodiments, the display substrate 100 may further comprise more (interlayer) insulating layers and intermediate conductive layers. For instance, as shown in FIG. 2, the second insulating layer 133, the intermediate conductive layer 132 and the first insulating layer 131 are sequentially arranged along the direction away from the base substrate 134.

As shown in FIG. 2, in some embodiments, the first insulating layer 131 includes first via holes 1311 and a second via hole 1312; conductive materials (for example, metallic materials such as tungsten) fill the first via hole 1311 and the second via hole 1312; the intermediate conductive layer 132 includes first conductive parts 1321 and second conductive parts 1322; and the second electrode 111 is electrically connected with the first conductive part 1321 through the first via hole 1311 (the conductive materials in the first via hole 1311) and electrically connected with the second conductive part 1322 through the connecting electrode 121 and the second via hole 1312 (the conductive materials in the second via hole 1312).

As shown in FIG. 2, in some embodiments, the second insulating layer 133 includes third via holes 1331 and a fourth via hole 1332; conductive materials (for example, metallic materials such as tungsten) fill the third via hole 1331 and the fourth via hole 1332; the second electrode 111 is electrically connected with a first area 1341 of the base substrate 134 through the first via hole 1311 (the conductive materials in the first via hole 1311), the first conductive part 1321 and the third via hole 1331 (the conductive materials in the third via hole 1331); and the first electrode 112 is electrically connected with a second area 1342 of the base substrate 134 through the connecting electrode 121, the second via hole 1312 (the conductive materials in the second via hole 1312), the second conductive part 1322 and the fourth via hole 1332 (the conductive materials in the fourth via hole 1332). For instance, the first area 1341 of the base substrate 134 is configured to provide the first voltage for the second electrode 111, and the second area 1342 of the base substrate 134 is configured to provide the second voltage for the first electrode 112; and the first voltage is, for example, greater than the second voltage. For instance, the base substrate 134 may include a first circuit disposed in the first area 1341 and a second circuit disposed in the second area 1342, and the first circuit and the second circuit are respectively in signal connection with the second electrode 111 and the connecting electrode 121. The via hole filled with tungsten may be referred to as a tungsten via hole (W-via hole). The first via hole 1311, the second via hole 1312, the third via hole 1331 and the fourth via hole 1332 may all be W-vias. No limitation will be given here in the embodiment of the present disclosure.

As shown in FIG. 2, in some embodiments, the number of the second electrodes 111, the number of the first via holes 1311, the number of the first conductive parts 1321, and the number of the third via holes 1331 are equal to each other. In some embodiments, the first insulating layer 131 includes a plurality of second via holes 1312. In this case, orthographic projections of the plurality of second via holes 1312 on the second insulating layer 133 are overall arranged in a ring, and the common electrode layer 116 (the first electrode 112) is electrically connected with the second area 1342 of the base substrate 134 through the connecting electrode 121, the plurality of second via holes 1312 and the second conductive part 1322. As the first insulating layer 131 includes the plurality of second via holes 1312, the resistance capacitance delay can be reduced, and the uniformity of signals of the common electrode layer 116 (the first electrode 112) can be improved.

In some embodiments, the second conductive part 1322 may be a continuous ring structure. In this case, the number of the second conductive part 1322 is one. In some other embodiments, the second conductive part 1322 may also be a discontinuous ring structure formed by a plurality of conductive patterns. In this case, the number of the conductive patterns of the second conductive part 1322 is equal to the number of the second via holes 1312.

Figure 4:
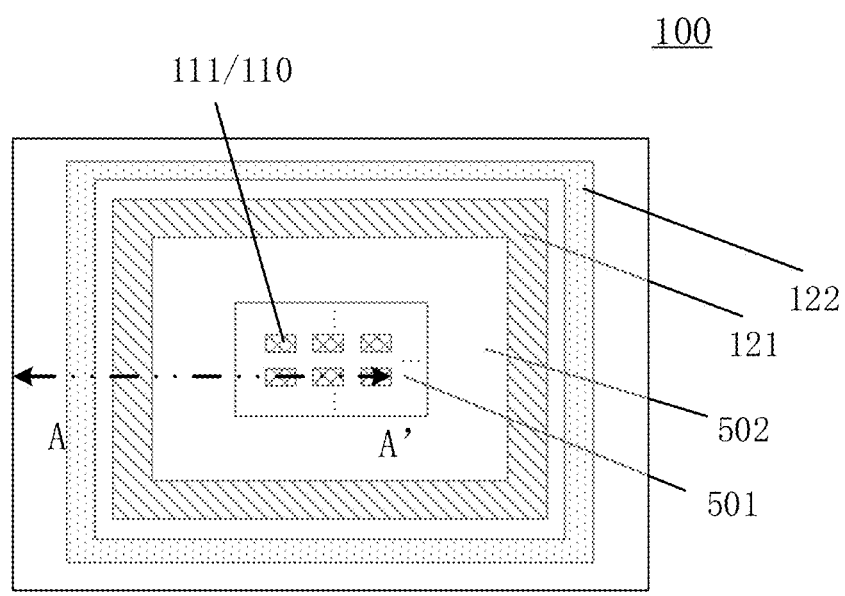
FIG. 4 is a schematic plan view of a display substrate provided by at least one embodiment of the present disclosure.
Figure 5:
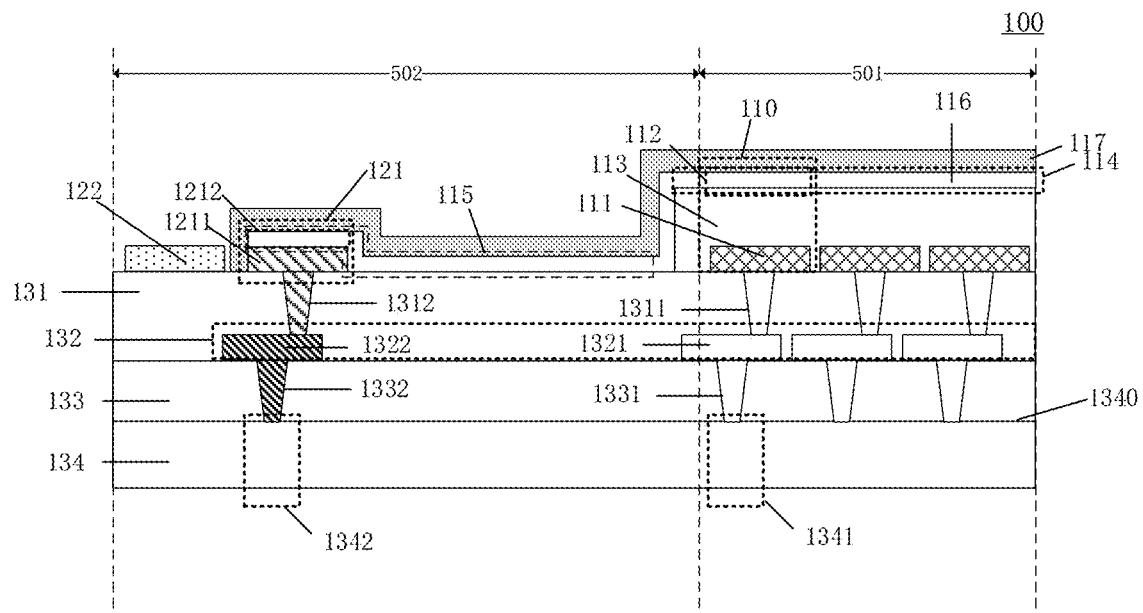
FIG. 5 is a cross-sectional view along line AA' in FIG. 4.
Figure 6:
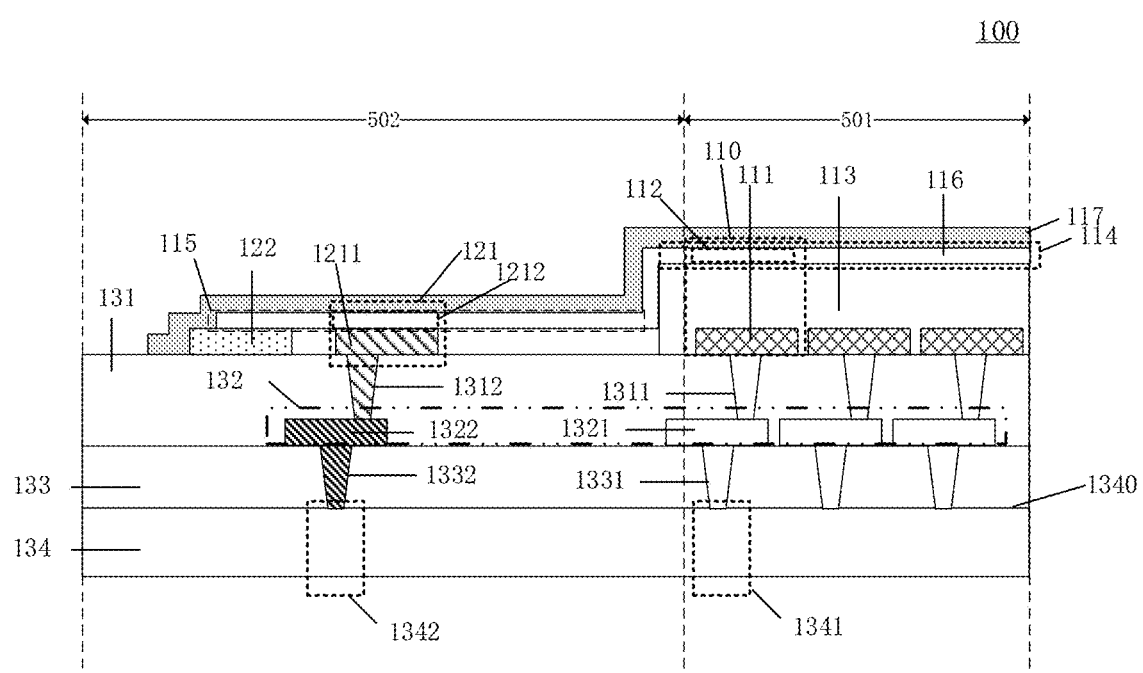
FIG. 6 is a cross-sectional view along line AA' in FIG. 4.
Figure 7:
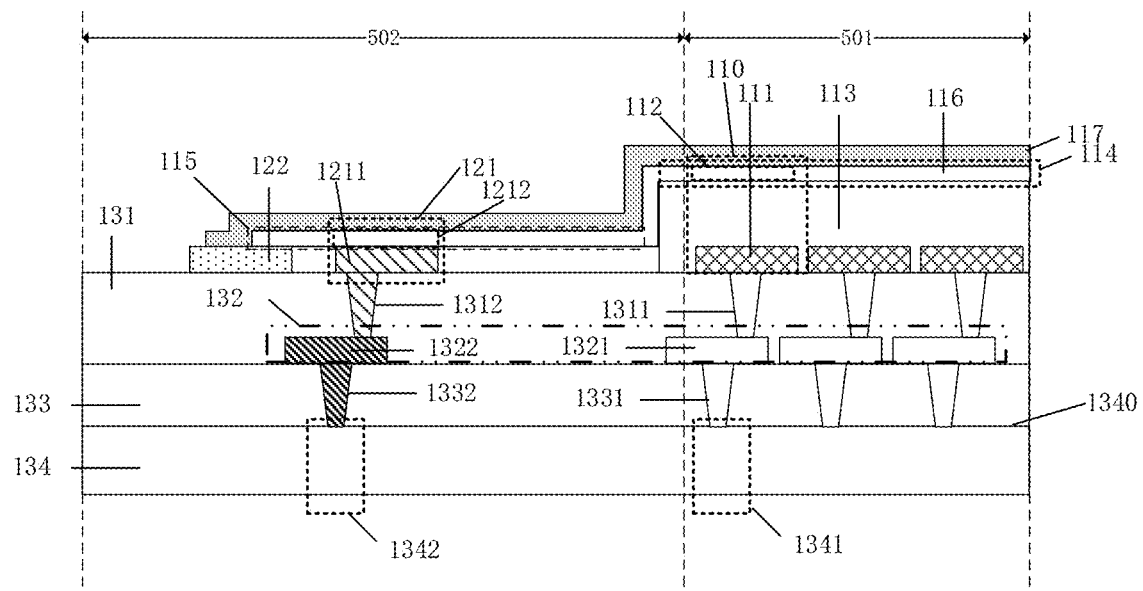
FIG. 7 is a cross-sectional view along line AA' in FIG. 4.

FIG. 4 is a schematic plan view of a display substrate provided by at least one embodiment of the present disclosure, and FIGS. 5, 6 and 7 are cross-sectional views along line AA' in FIG. 4. As shown in FIGS. 4 to 7, in at least one embodiment of the present disclosure, the peripheral area 502 also includes a first dummy electrode 122; the first dummy electrode 122 is arranged on the surface 1340 of the base substrate 134 and at least partially surrounds the connecting electrode 121 (for example, ring-shaped); and the connecting electrode 121 is disposed between the first dummy electrode 122 and the array area 501. The first dummy electrode 122 is spaced from the connecting electrode 121.

As shown in FIG. 5, in some embodiments, the second common electrode layer 115 and the first dummy electrode 122 may be not overlapped in the direction perpendicular to the surface 1340 of the array substrate 134, that is, the edge of the second common electrode layer 115 is closer to the array area 501 than the edge of the first dummy electrode 122 which is close to the array area 501. As shown in FIGS. 6 and 7, in some other embodiments, the first dummy electrode 122 may be at least partially overlapped with the second common electrode layer 115 in the direction perpendicular to the surface 1340 of the array substrate 134 and is electrically connected with the second common electrode layer 115, that is, the second conductive sublayer 1212 of the connecting electrode 121 may be extended to be at least partially overlapped with the first dummy electrode 122 in the direction perpendicular to the surface 1340 of the array substrate 134 and be electrically connected with the first dummy electrode 122.

Due to the arrangement of the first dummy electrode 122, the development and etching uniformity and the performance of the display substrate 100 can be further improved. For instance, by the arrangement of the first dummy electrode 124, the effective time required by acquiring the connecting electrode 121 (the outer edge of the connecting electrode 121) through etching can be increased, so that the effective time required by acquiring the connecting electrode 121 through etching is closer to the effective time required by acquiring the second electrode 111 through etching.

In some embodiments, the first dummy electrode 122 is arranged in the same structural layer as the second electrode 111 and the first conductive sublayer 1211 of the connecting electrode 121. For instance, the second electrode 111, the first conductive sublayer 1211 of the connecting electrode 121, and the first dummy electrode 122 may be obtained by patterning the same conductive layer (such as a single conductive layer) through the same patterning process.

In some embodiments, the light extraction layer 117 may be not overlapped with the first dummy electrode 122. As shown in FIG. 5, the edge of the light extraction layer 117 may be disposed between the first dummy electrode 122 and the connecting electrode 121.

In some other embodiments, the light extraction layer 117 may be at least partially overlapped with the first dummy electrode 122. As shown in FIG. 6, in some embodiments, a projection of the first dummy electrode 122 on the base substrate 134 is within the projection of the light extraction layer 117 on the base substrate 134, that is, the edge of the light extraction layer 117 is farther away from the array area 501 than the edge of the first dummy electrode 122 away from the array area 501. As shown in FIG. 7, in some other embodiments, the edge of the first dummy electrode 122 away from the array area 501 is farther away from the array area 501 than the edge of the light extraction layer 117. It should be understood that the edge of the first dummy electrode 122 away from the array area 501 may also be flush with the edge of the light extraction layer 117. No limitation will be given here in the embodiment of the present disclosure.

For the convenience of description, description of the embodiments of the present disclosure will be given below by taking the case that the first dummy electrode 122 is partially overlapped with the second common electrode layer 115 in the direction perpendicular to the surface 1340 of the array substrate 134 and the projection of the first dummy electrode 122 on the base substrate 134 is within the projection of the light extraction layer 117 on the base substrate 134 as an example. However, it should be understood that the embodiment of the present disclosure is not limited thereto.

It should be understood that in some embodiments, the first dummy electrode 122 may include at least two ring electrodes which are all arranged around the connecting electrode 121 and spaced from each other. For instance, a part of the first dummy electrode 122 in the row direction includes two rows of subelectrodes, and a part of the first dummy electrode 122 in the column direction includes two columns of subelectrodes.

Figure 8:
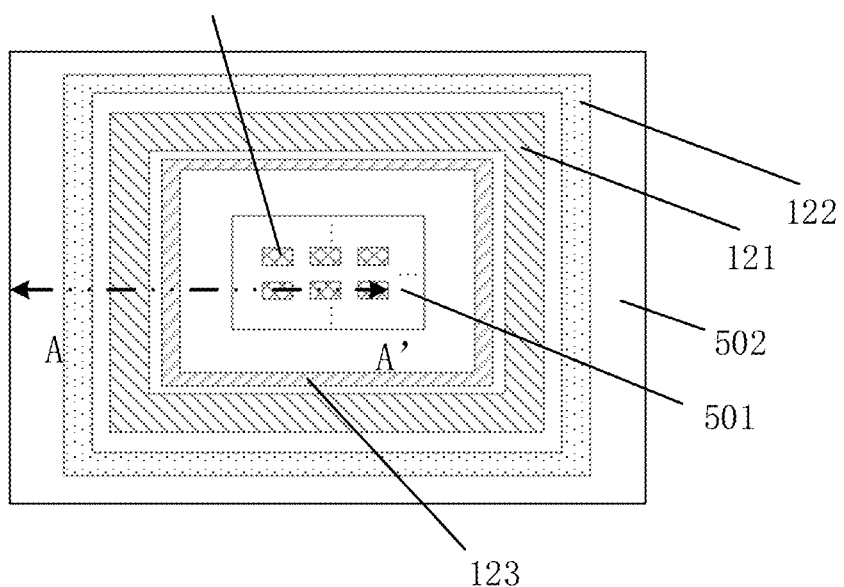
FIG. 8 is a schematic plan view of a display substrate provided by at least one embodiment of the present disclosure.
Figure 9:
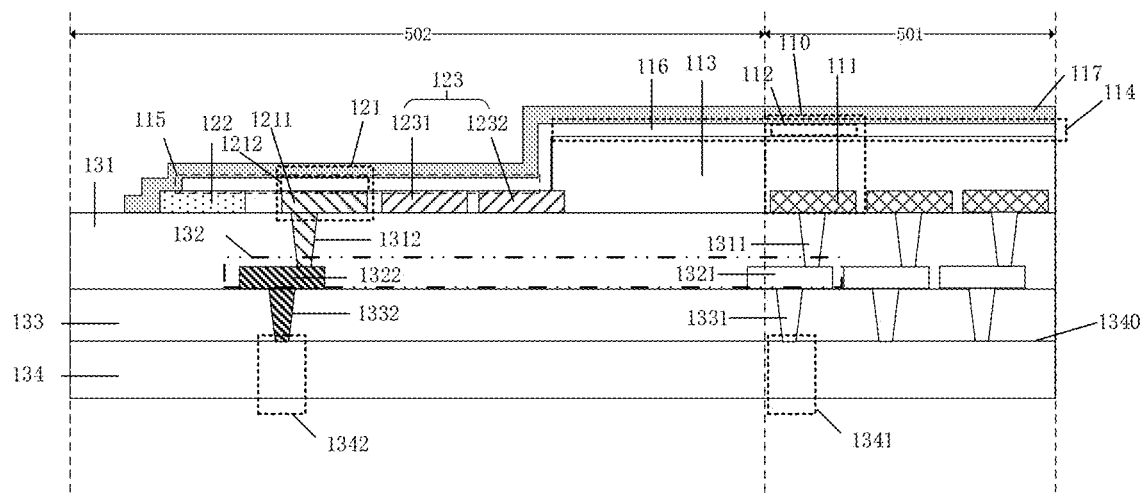
FIG. 9 is a cross-sectional view along line AA' in FIG. 8.

FIG. 8 is a schematic plan view of a display substrate provided by at least one embodiment of the present disclosure, and FIG. 9 is a cross-sectional view along line AA' in FIG. 8.

As shown in FIGS. 8 and 9, in at least one embodiment of the present disclosure, the peripheral area 502 further includes a second dummy electrode 123. The second dummy electrode 123 is arranged on the surface 1340 of the base substrate 134 and at least partially surrounds the array area 501 (for example, ring-shaped). The second dummy electrode 123 is disposed between the connecting electrode 121 and the array area 501, and the second dummy electrode 123 is spaced from the connecting electrode 121. The second common electrode layer 115 is overlapped with the second dummy electrode 123, that is, the second conductive sublayer 1212 of the connecting electrode 121 may be extended to be at least partially overlapped with the second dummy electrode 123 in the direction perpendicular to the surface 1340 of the base substrate 134. The light emitting layer 113 of the light emitting subunit 110 adjacent to the second dummy electrode 123 extends to be at least partially overlapped with the second dummy electrode 123 in the direction perpendicular to the surface 1340 of the base substrate 134, and the first electrode 112 of the light emitting subunit 110 adjacent to the second dummy electrode 123 extends to be at least partially overlapped with the second dummy electrode 123 in the direction perpendicular to the surface 1340 of the base substrate 134. That is to say, projections of the light emitting layer 113 and the first electrode 112 of the light emitting subunit 110 adjacent to the second dummy electrode 123 are at least partially overlapped with a projection of the second dummy electrode 123 on the base substrate 134.

It should be understood that in some embodiments, the second dummy electrode 123 may include at least two ring-shaped subelectrodes which are all arranged around the array area 501 and spaced from each other. For instance, a part of the second dummy electrode 123 in the row direction includes two rows of subelectrodes, and a part of the second dummy electrode 123 in the column direction includes two columns of subelectrodes. FIG. 9 shows an example that the second dummy electrode 123 includes two ring-shaped subelectrodes 1231 and 1232. However, it should be understood that the embodiment of the present disclosure is not limited thereto.

For instance, as shown in FIGS. 8 and 9, the arrangement of the second dummy electrode 123 can reduce the breakage risk of the common electrode layer 116, for example, reducing the extension lengths of different areas of the common electrode layer 116 in the direction perpendicular to the surface 1340 of the base substrate 134. Moreover, the arrangement of the second dummy electrode 123 can also improve the flatness of the common electrode layer 116, for example, avoiding the case that a part of the common electrode layer 116 falls into a gap between the connecting electrode 121 and the second electrode 111 adjacent to the common electrode layer. Furthermore, the arrangement of the second dummy electrode 123 can also improve the uniformity of electrical signals of the common electrode layer 116 and improve the development and etching uniformity. That is, the uniformity of products is improved while the process success rate is ensured.

For instance, the arrangement of the second dummy electrode 123 can also reduce the amount of the etching solution (or etching gas) at the periphery of the connecting electrode 121 in the etching process, so the time required by acquiring the connecting electrode 121 (cathode ring) through etching can be closer to the time required by acquiring the second electrode 111 through etching, and then the etching uniformity can be improved.

In some embodiments, the second dummy electrode 123 is arranged in the same structural layer as the second electrode 111, the first conductive sublayer 1211 of the connecting electrode 121, and the first dummy electrode 122. For instance, the second electrode 111, the first conductive sublayer 1211 of the connecting electrode 121, the first dummy electrode 122 and the second dummy electrode 123 may be obtained by patterning the same conductive layer (for example, a single conductive layer) through the same patterning process.

Figure 10:
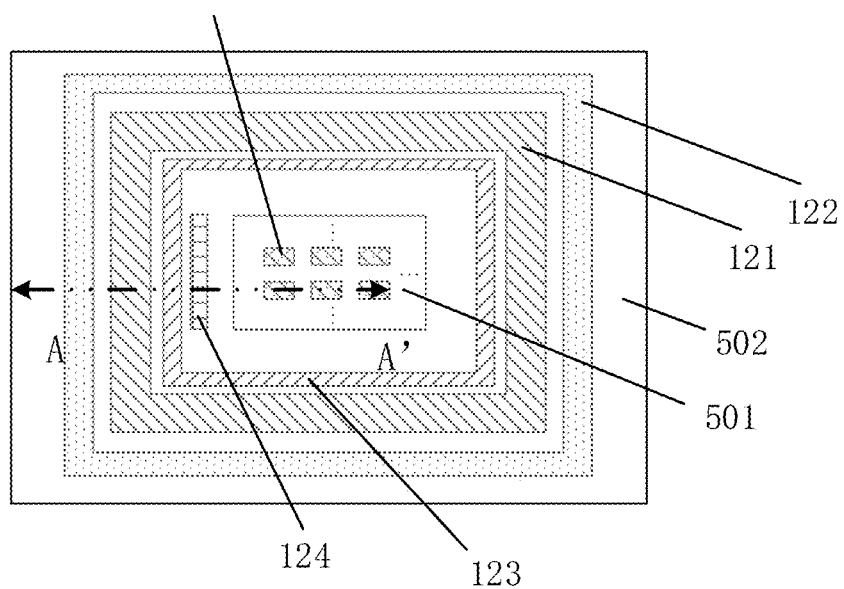
FIG. 10 is a schematic plan view of display substrate provided by at least one embodiment of the present disclosure.
Figure 11:
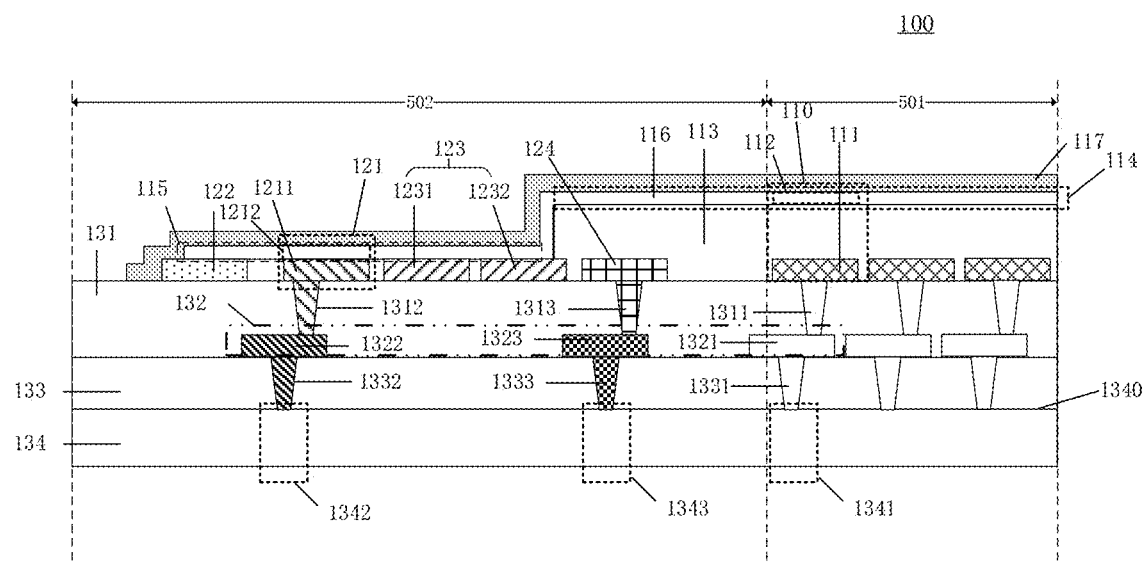
FIG. 11 is a cross-sectional view along line AA' in FIG. 10.

FIG. 10 is a schematic plan view of a display substrate provided by at least one embodiment of the present disclosure, and FIG. 11 is a cross-sectional view along line AA' in FIG. 10. As shown in FIGS. 10 and 11, in at least one embodiment of the present disclosure, the peripheral area 502 also includes a sensor electrode 124 which is disposed between the second dummy electrode 123 and the array area 501 on the surface 1340 of the base substrate 134, and the light emitting layer 113 and the first electrode 112 of the light emitting subunit 110 adjacent to the second dummy electrode 123 extend to cover the sensor electrode 124. That is to say, a projection of the sensor electrode 124 on the base substrate 134 is within the projections of the light emitting layer 113 and the first electrode 112 of the light emitting subunit 110 adjacent to the second dummy electrode 123 on the base substrate 134. For instance, the first common electrode 114 and the light emitting layer 113 can completely cover the sensor electrode 124.

The sensor electrode 124 may form the same structure with the second electrode 111 of the light emitting subunit 110. For instance, the shape and the pattern density of the sensor electrode 124 may be the same as the shape and the pattern density of the second electrode 111.

For instance, the sensor electrode 124 may be configured to sense the voltage of the second electrode 111 of the array area 501 and is used for realizing circuit compensation. For instance, the sensor electrode 124 may be connected to a sensor through a compensation transistor to sense the voltage of the second electrode 111 of the array area 501.

As shown in FIG. 10, the sensor electrode 124, for instance, may be only disposed on one side of the array area 501. However, no limitation will be given here in the embodiment of the present disclosure.

As shown in FIG. 11, in some embodiments, the first insulating layer 131 includes a fifth via hole 1313; a conductive material(s) (for example, a metallic material such as tungsten) fills the fifth via hole 1313; the intermediate conductive layer 132 includes a third conductive part 1323; and the sensor electrode 124 is electrically connected with the third conductive part 1323 through the fifth via hole 1313 (the conductive material in the fifth via hole 1313).

As shown in FIG. 11, in some embodiments, the second insulating layer 133 includes a sixth via hole(s) 1333; a conductive material (for example, a metallic material such as tungsten) fills the sixth via hole 1333; and the sensor electrode 124 is electrically connected with a third area 1343 of the base substrate 134 through the fifth via hole 1313 (the conductive material in the fifth via hole 1313), the third conductive part 1323 and the sixth via hole 1333 (the conductive materials in the sixth via hole 1333). Similarly, both the fifth via hole 1313 and the sixth via hole 1333 may be W-vias. No limitation will be given here in the embodiment of the present disclosure.

For instance, the base substrate 134 may include a third circuit disposed in the third area 1343, and the sensor circuit 124 is in signal connection with the third circuit and is connected to the sensor through the third circuit, in which the third circuit, for instance, may include a compensation transistor formed in the base substrate 34.

As shown in FIG. 11, in some embodiments, the number of the sensor electrodes 124, the number of the fifth via holes 1313, the number of the third conductive parts 1323, and the number of the sixth via holes 1333 are equal to each other.

In some embodiments, the sensor electrode 124 is arranged in the same structural layer with the second electrode 111, the first conductive sublayer 1211 of the connecting electrode 121, the first dummy electrode 122 and the second dummy electrode 123. For instance, the second electrode 111, the first conductive sublayer 1211 of the connecting electrode 121, the first dummy electrode 122, the second dummy electrode 123 and the sensor electrode 124 may be obtained by patterning the same conductive layer (such as a single conductive layer) through the same patterning process.

The sensor electrode 124 may be, for instance, adopted for the simulation detection of the working situation of the light emitting subunit 110 in the array area 501.

Figure 12:
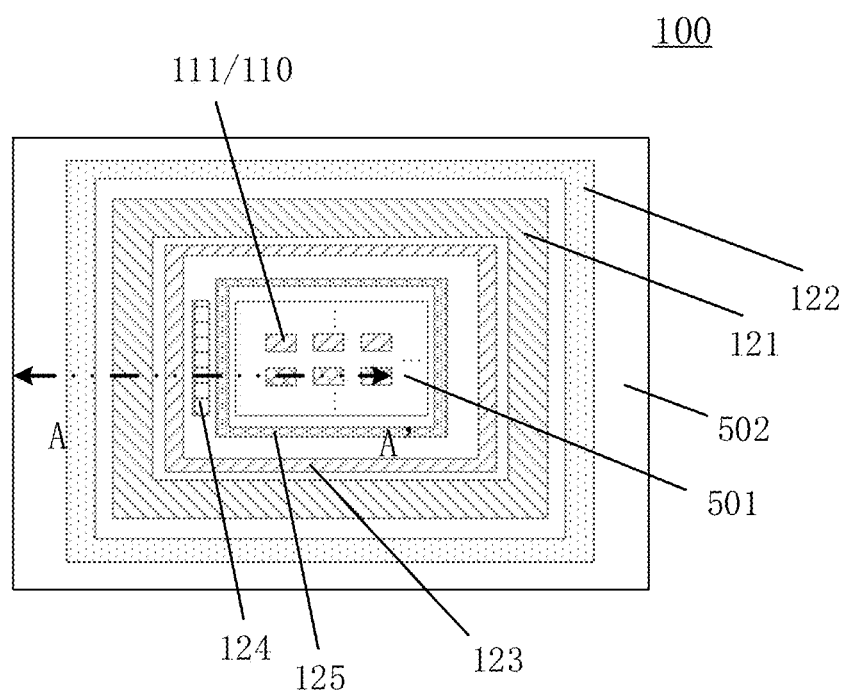
FIG. 12 is a schematic plan view of a display substrate provided by at least one embodiment of the present disclosure.

FIG. 12 is a schematic plan view of a display substrate provided by at least one embodiment of the present disclosure, and FIG. 12 is a cross-sectional view along line AA' in FIG. 10.

Figure 13:
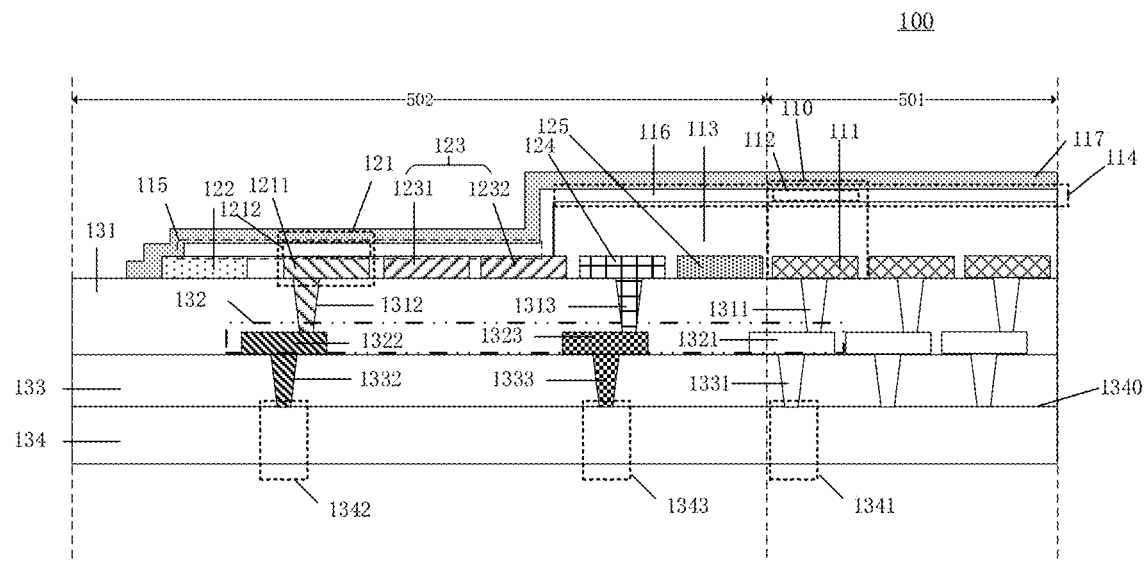
FIG. 13 is a cross-sectional view along line AA' in FIG. 12.

As shown in FIGS. 12 and 13, in at least one embodiment of the present disclosure, the peripheral area 502 also includes a third dummy electrode 125. The third dummy electrode 125 is disposed between the second dummy electrode 123 and the array area 501 and between the sensor electrode 124 and the array area 501. Moreover, the third dummy electrode 125 may be arranged on the surface 1340 of the base substrate 134 and at least partially surrounds the array area 501 (for example, ring-shaped). The light emitting layer 113 and the first electrode 112 of the light emitting subunit 110 adjacent to the second dummy electrode 123 cover the third dummy electrode 125. That is to say, a projection of the third dummy electrode on the base substrate 134 is within the projections of the light emitting layer 113 and the first electrode 112 of the light emitting subunit 110 adjacent to the second dummy electrode 123 on the base substrate 134. For instance, the first common electrode layer 114 and the light emitting layer 113 may completely cover the third dummy electrode 125.

It should be understood that in some embodiments, the third dummy electrode 125 may include at least one ring-shaped subelectrode which is arranged around the array area 501 and spaced from each other.

In some embodiments, the third dummy electrode 125 is arranged in the same structural layer as the second electrode 111, the first conductive sublayer 1211 of the connecting electrode 121, the first dummy electrode 122 and the second dummy electrode 123. For instance, the second electrode 111, the first conductive sublayer 1211 of the connecting electrode 121, the first dummy electrode 122, the second dummy electrode 123, the sensor electrode 124 and the third dummy electrode 125 may be obtained by patterning the same conductive layer (such as a single conductive layer) through the same patterning process. For instance, the shapes and the pattern densities of the second electrode 111, the first conductive sublayer 1211 of the connecting electrode 121, the first dummy electrode 122, the second dummy electrode 123 and the third dummy electrode 125 are all the same, so that the consumption rate of an etching solution or a development solution at various areas during etching or development is roughly the same, thereby ensuring the uniformity of the process.

For instance, as shown in FIGS. 12 and 13, the arrangement of the third dummy electrode 125 can reduce the breakage risk of the common electrode layer 116 (for example, reducing the extension lengths of different areas of the common electrode layer 116 in a direction perpendicular to a planar surface of a substrate of an electronic device), improve the flatness of the common electrode layer 116 (for example, avoiding the case that a part of the common electrode layer 116 falls into a gap between the sensor electrode 124 and the second electrode 111 which are adjacent to the common electrode layer) and the uniformity of electrical signals on the common electrode layer 116, and improve the development and etching uniformity. That is, the uniformity of products is improved while the process success rate is ensured.

As shown in FIGS. 2, 5, 6, 7, 9, 11 and 13, the first dummy electrode 122, the second dummy electrode 123 and the third dummy electrode 125 are in the floating state relative to the base substrate 134. The floating state mentioned here refers to that the first dummy electrode 122, the second dummy electrode 123 and the third dummy electrode 125 are not electrically connected with a circuit structure in the base substrate 134 through via holes in the first insulating layer 131 and the second insulating layer 133. That is to say, there are no via holes for connecting the first dummy electrode 122, the second dummy electrode 123, the third dummy electrode 125 and the circuit structure in the base substrate 134.

It should be noted that in the embodiment of the present disclosure, the connecting electrode 121, the first dummy electrode 122, the second dummy electrode 123 and the third dummy electrode 125 refer to conductive structures with ring profile. For instance, the connecting electrode 121, the first dummy electrode 122, the second dummy electrode 123 and the third dummy electrode 125 may be all continuous ring structures or noncontinuous ring structures formed by conductive patterns. No limitation will be given here in the embodiment of the present disclosure.

Figure 14:
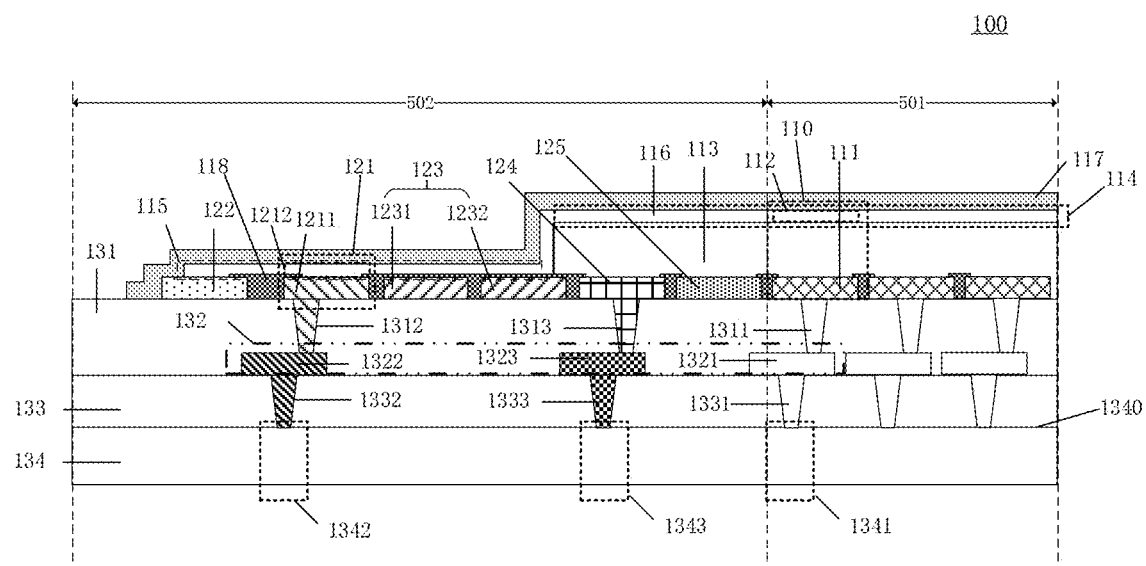
FIG. 14 is a schematic structural view of a display substrate provided by at least one embodiment of the present disclosure.

As shown in FIG. 14, in some embodiments of the present disclosure, the display substrate 100 further comprises a pixel define layer 118. In the array area 501, the pixel define layer 118 is disposed between the second electrodes 111 of adjacent light emitting subunits 110, so as to define the light emitting subunits 110, namely defining pixels. In addition, the pixel define layer 118 may also be disposed in the peripheral area 502.

For instance, the pixel define layer 118 is disposed on at least one of the following positions: between the second electrodes 111 of adjacent light emitting subunits 110; between the connecting electrode 121 and the first dummy electrode 122; between the connecting electrode 121 and the second dummy electrode 123; between the second dummy electrode 123 and the sensor electrode 124; between the sensor electrode 124 and the third dummy electrode 125; between the third dummy electrode 125 and the second electrode 111 of an adjacent light emitting subunit 110; or between the second dummy electrode 123 and the light emitting layer 113 of an adjacent light emitting subunit 110. As shown in FIG. 13, in some embodiments, the second dummy electrode 123 may be completely covered by the pixel define layer 118, that is, the pixel define layer 118 covers a surface of the second dummy electrode 123 away from the base substrate 134 and fills between the two ring-shaped subelectrodes 1231 and 1232 of the second dummy electrode 123, and the pixel define layer 118 also covers a side surface of the second dummy electrode 123. In the case where the first dummy electrode 122 includes two ring-shaped subelectrodes, the pixel define layer 118 may also be disposed between the two ring-shaped subelectrodes.

For instance, in the array area 501, the pixel define layer 118 includes a plurality of openings which are configured to evaporate materials of the light emitting layer 113 to form the light emitting layer 113.

The pixel define layer 118 may be made from an insulating material. For instance, the pixel define layer 118 may be made from one or more organic materials selected from the group consisting of benzocyclobutene (BCB), polyimide (PI), polyamide (PA), acrylic resin and phenolic resin. For instance, the pixel define layer 118 may also be made from an inorganic material(s) such as silicon nitride. The pixel define layer 118 may be formed by forming methods known in the art. No limitation will be given here in the embodiment of the present disclosure.

Figure 15:
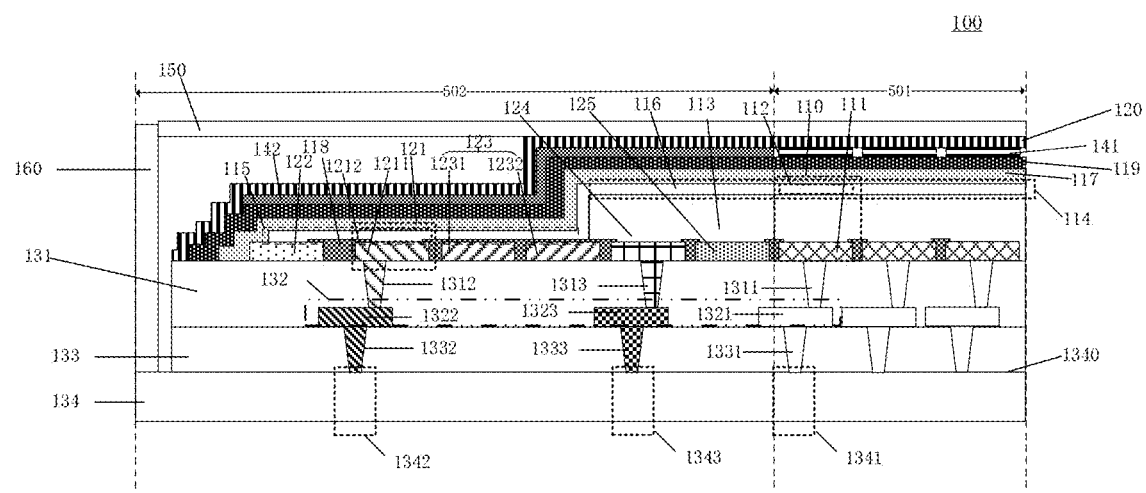
FIG. 15 is a schematic structural view of a display substrate provided by at least one embodiment of the present disclosure.

As shown in FIG. 15, in some embodiments, the display substrate 100 may further comprise a first encapsulation layer 119, a second encapsulation layer 120 and a color filter layer. The first encapsulation layer 119 is disposed on a side of the light extraction layer 117 away from the base substrate 134; the second encapsulation layer 120 is disposed on a side of the first encapsulation layer 119 away from the base substrate 134; and the color filter layer is sandwiched between the first encapsulation layer 119 and the second encapsulation layer 120.

In some embodiments, the projection of the light extraction layer 117 on the base substrate 134 is within a projection of the first encapsulation layer 119 on the base substrate 134, and the projection of the first encapsulation layer 119 on the base substrate 134 is within a projection of the second encapsulation layer 120 on the base substrate 134. That is to say, the first encapsulation layer 119 may completely cover the light extraction layer 117, and the second encapsulation layer 120 may completely cover the first encapsulation layer 119. For instance, the area of the projection of the light extraction layer 117 on the base substrate 134 is less than the area of the projection of the first encapsulation layer 119 on the base substrate 134, and the area of the projection of the first encapsulation layer 119 on the base substrate 134 is less than the area of the projection of the second encapsulation layer 120 on the base substrate 134.

The first encapsulation layer 119 may seal the light emitting subunits 110 and prevent external oxygen and moisture from permeating into the light emitting subunits 110. The second encapsulation layer 120 is configured to encapsulate the color filter layer and prevent external oxygen and moisture from permeating into the color filter layer and the light emitting subunits 110. In addition, the second encapsulation layer 120 is also configured to prevent the color filter layer from being damaged in the subsequent manufacturing processes. The second encapsulation layer 120 may be the same as or different from the first encapsulation layer 119. No limitation will be given here in the embodiment of the present disclosure.

In some embodiments, both the first encapsulation layer 119 and the second encapsulation layer 120 may include a structure in which at least one inorganic layer and at least one organic layer are stacked. The first encapsulation layer 119 and the second encapsulation layer 120 may be formed by known materials and known forming method in the art. No limitation will be given here in the embodiment of the present disclosure.

In some embodiments, the color filter layer may include a first color filter part 141 disposed in the array area 501 and a second color filter layer 142 disposed in the peripheral area 502. The first color filter part 141 is disposed on a light-outgoing path of the display substrate 100, and may convert light emitted by the light emitting subunits 110 into light of another color.

In some embodiments, the first color filter part 141 may include a plurality of color filter subunits arranged in an array, and the plurality of color filter subunits may be in one-to-one correspondence with the plurality of light emitting subunits 110 in the array area 501. For instance, the color filter subunits may be disposed in light-outgoing paths of the light emitting subunits 110. The plurality of color filter subunits of the first color filter part 141 may include at least one color such as red, green and blue. In some embodiments, black matrixes (BMs) (not shown) may also be disposed between the color filter subunits.

The second color filter part 142 disposed in the peripheral area 502 may cover and shield the above connecting electrode 121, the first dummy electrode 122, the second dummy electrode 123, the sensor electrode 124 and the third dummy electrode 125, so as to prevent light from passing through the connecting electrode 121, the first dummy electrode 122, the second dummy electrode 123, the sensor electrode 124 and the third dummy electrode 125 and then entering the eyes of users. A projection of the second color filter part 142 on the base substrate 134 may be within the projections of the first encapsulation layer 119 and the second encapsulation layer 120 on the base substrate 134, and edges of the first encapsulation layer 119 and the second encapsulation layer 120 may make contact with each other to prevent external oxygen and moisture from permeating into the color filter layer. For instance, the area of the projection of the color filter layer on the base substrate 134 may be less than the area of the projection of the first encapsulation layer 119 on the base substrate 134. That is to say, the area of the projections of the first color filter part 141 and the second color filter part 142 on the base substrate 134 may be less than the area of the projection of the first encapsulation layer 119 on the base substrate 134.

The first color filter part 141 and the second color filter part 142 may be formed by the known materials and the known forming method in the art. No limitation will be given here in the embodiment of the present disclosure.

As shown in FIG. 15, the display substrate may further comprise a cover plate 150 which is disposed on a side of the second encapsulation layer 120 away from the base substrate 134. The cover plate 150, for instance, may be formed by plastics, glass, etc. The cover plate 150 may prevent the invasion of external oxygen and moisture and protect the second encapsulation layer 120. For instance, a sealant 160 may be adopted to connect the cover plate 150 and the base substrate 134 to prevent the invasion of moisture, thereby prolonging the service life of the display substrate 100.

For instance, the attachment height of the sealant 160 at side surfaces of the cover plate 150 is greater than ½ of the thickness of the cover plate 150 and less than the thickness of the cover plate 150. That is to say, the distance between an upper edge of the sealant 160 and an upper surface of the cover plate 150 is less than ½ of the thickness of the cover plate 150, so as to ensure the sealing effect and prevent the sealant from being higher than the upper surface of the cover plate 150 and resulting in the increased thickness of the display device. As the side surfaces of the cover plate 150 and the silicon-base base substrate are sealed by the sealant 160, the prevention of the invasion of water and moisture is further guaranteed and the service life of the display substrate 100 is greatly improved. In some embodiments, the projection of the second encapsulation layer 120 on the base substrate 134 may be within a projection of the cover plate 150 on the base substrate 134. For instance, the area of the projection of the second encapsulation layer 120 on the base substrate 134 may be less than the area of the projection of the cover plate 150 on the base substrate 134.

Figure 16:
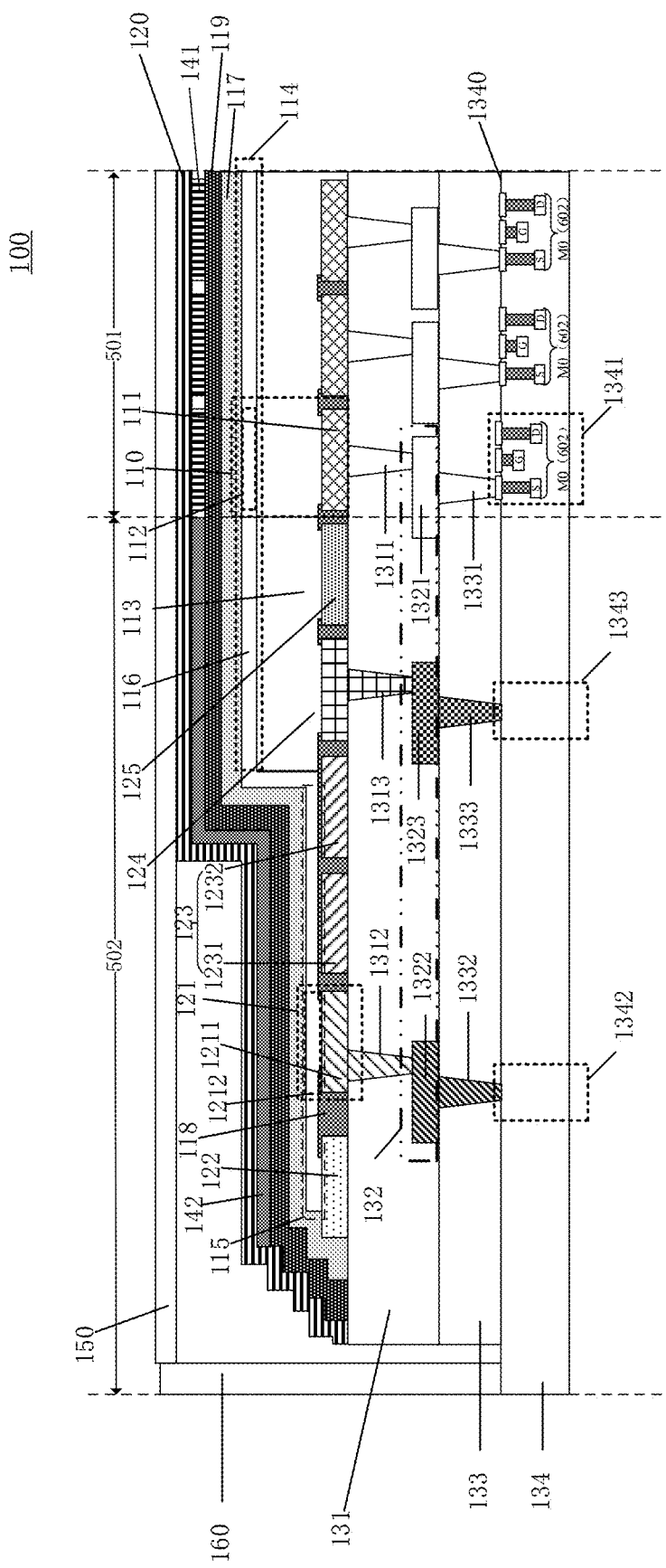
FIG. 16 is a schematic structural view of a display substrate provided by at least one embodiment of the present disclosure.

FIG. 16 is a schematic structural view of a display substrate provided by at least one embodiment of the present disclosure. Except that the structure of the base substrate 134 in FIG. 5 is illustrated in more detail, the display substrate provided by the embodiment is substantially the same as the display substrate 100 as shown in FIG. 15. It should be understood that the base substrate 134 in the embodiment may be completely the same as or substantially the same as the base substrate 134 as shown in FIGS. 1 to 15, and for the conciseness of description, the detailed structure of the base substrate 134 is not shown in FIGS. 1-15. Certainly, the base substrate 134 in the embodiment may also be different from the base substrate 134 as shown in FIGS. 1-15, as long as corresponding functions can be realized.

In the embodiment, as shown in FIG. 16, the first area 1341 of the base substrate 134 includes a pixel circuit 602. The pixel circuit 602 is electrically connected with the second electrode 111 through the third via hole 1331 (the conductive material in the third via hole 1331), the first conductive part 1321 and the first via hole 1311 (the conductive material in the first via hole 1311), and is configured to drive the light emitting subunit 110 to emit light. The pixel circuit 602 at least includes a driving transistor MO and a switching transistor (not shown in the figure), and the driving transistor MO is electrically connected with the second electrode 111. Thus, the electrical signals for driving the light emitting subunits 110 may be transmitted to the second electrodes 111, so as to control the light emitting subunits 110 to emit light. For instance, the driving transistor MO includes a gate electrode G, a source electrode S and a drain electrode D. The source electrode S of the driving transistor MO is electrically connected to the second electrode 111. When the driving transistor MO is in the on state and in the saturated state, under the control of the data voltage applied by the gate electrode, the driving current provided by a power line may be transmitted to an anode layer 1021 through the source electrode S of the driving transistor MO and the second electrode 111. As a voltage difference is formed between the second electrode 111 and the first electrode 111, an electric field is formed between the second electrodes and the first electrodes, and holes and electrons are respectively injected into the light emitting layer 113 and combined, so that the light emitting layer 113 emits light under the action of the electric field. It should be understood that in the driving transistor MO, the positions of the source electrode S and the drain electrode D may be interchangeable, as long as one of the source electrode S and the drain electrode D is electrically connected with the second electrode 111.

The display substrate provided by the embodiment of the present disclosure not only can improve the light exiting ratio but also can improve the encapsulation effect, thereby prolonging the service life of the display substrate.

At least one embodiment of the present disclosure further provides a method of manufacturing a display substrate, which may be used for manufacturing the display substrate provided by any one of the foregoing embodiments, wherein the display substrate is defined to be an array area and a peripheral area surrounding the array, and the display substrate includes a base substrate. FIG. 17 is a schematic flow chart of the method of manufacturing the display substrate provided by at least one embodiment of the present disclosure.

As shown in FIG. 17, the method 200 of manufacturing the display substrate provided by at least one embodiment of the present disclosure includes the steps S202 to S206.

S202: disposing a plurality of light emitting subunits in the array area on a surface of the base substrate, wherein each of the plurality of light emitting subunits includes: a first electrode, a second electrode and a light emitting layer which are laminated on a surface of the base substrate; the light emitting layer is between the first electrode and the second electrode; the first electrode is farther away from the base substrate than the light emitting layer; and the first electrodes of the plurality of light emitting subunits are electrically connected with each other.

The description of the light emitting subunits and the base substrate may refer to the above embodiments, and no further description will be given here.

S204: disposing a connecting electrode surrounding the array area in the peripheral area on the surface of the base substrate, wherein the connecting electrode is electrically connected with the first electrode.

The description of the connecting electrode may refer to the above embodiments, and no further description will be given here.

S206: disposing a light extraction layer on a side of the first electrode and the connecting electrode away from the base substrate, so that projections of the first electrode and the connecting electrode on the base substrate are within a projection of the light extraction layer on the base substrate in at least one direction parallel to the surface.

The description of the light extraction layer may refer to the above embodiments, and no further description will be given here.

In some embodiments, the method 200 of manufacturing the display substrate may further comprise: disposing, on the surface of the base substrate, a first dummy electrode at least partially surrounding the array area, so that the connecting electrode is between the first dummy electrode and the array area; disposing, on the surface of the base substrate between the connecting electrode and the array area, a second dummy electrode at least partially surrounding the array area; disposing a sensor electrode on the surface of the base substrate between the second dummy electrode and the array area; and disposing, on the surface of the base substrate between the sensor electrode and the array area, a third dummy electrode at least partially surrounding the array area.

The description of the first dummy electrode, the second dummy electrode, the sensor electrode and the third dummy electrode may refer to the above embodiments, and no further description will be given here.

In some embodiments, the method 200 of manufacturing the display substrate may further comprise the step of providing a pixel define layer at at least one of the following positions: between the second electrodes of adjacent light emitting subunits; between the connecting electrode and the first dummy electrode; between the connecting electrode and the second dummy electrode; between the second dummy electrode and the sensor electrode; between the sensor electrode and the third dummy electrode; between the third dummy electrode and the second electrode of an adjacent light emitting subunit; or between the second dummy electrode and the light emitting layer of an adjacent light emitting subunit.

The description of the pixel define layer may refer to the above embodiments, and no further description will be given here.

In some embodiments, the method 200 of manufacturing the display substrate may further comprise: disposing a first encapsulation layer on a side of the light extraction layer away from the base substrate; disposing a color filter layer on a side of the first encapsulation layer away from the base substrate; and providing a second encapsulation layer on a side of the color filter layer away from the base substrate.

The description of the first encapsulation layer, the color filter layer and the second encapsulation layer may refer to the above embodiments, and no further description will be given here.

In some embodiments, the method 200 of manufacturing the display substrate may further comprise: disposing a cover plate on a side of the second encapsulation layer away from the base substrate. The description of the cover plate may refer to the above embodiments, and no further description will be given here.

The method of manufacturing the display substrate provided by the embodiments of the present disclosure not only can improve the light exiting ratio of the display substrate but also can improve the encapsulation effect of the display substrate, thereby prolonging the service life of the display substrate.

Figure 18:
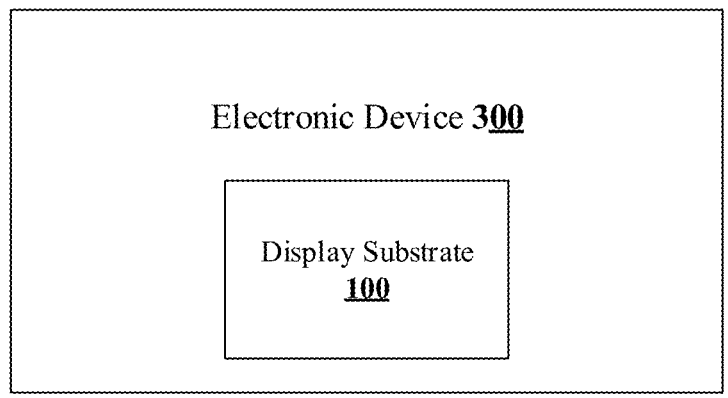
FIG. 18 is a schematic block diagram of an electronic device provided by at least one embodiment of the present disclosure.

At least one embodiment of the present disclosure further provides an electronic device. FIG. 18 is a schematic diagram of an electronic device provided by at least one embodiment of the present disclosure. As shown in FIG. 18, the electronic device 300 comprises the display substrate 100 provided by any one of the embodiments of the present disclosure. For instance, the electronic device 300 may be: a product or component with a display function such as a liquid crystal display television, a display, an OLED television, an e-paper display device, a mobile phone, a tablet computer, a notebook computer, a digital album, a navigator, etc.

It should be noted that for clarity and conciseness, the embodiments of the present disclosure do not give all the constituent units of the electronic device 300. In order to realize the basic functions of the electronic device 300, those skilled in the art may provide and arrange other structures not shown according to specific requirements. No limitation will be given here in the embodiment of the present disclosure.

The technical effects of the electronic device 300 provided by the embodiment may refer to the technical effects of the display device provided by the embodiment of the present disclosure. No further description will be given here.

The following statements should be noted:
(1) The accompanying drawings involve only the structure(s) in connection with the embodiment(s) of the present disclosure, and other structure(s) can be referred to common design(s).
(2) In case of no conflict, the embodiments of the present disclosure and the features in the embodiments may be combined with each other to obtain new embodiments.

What are described above is related to the illustrative embodiments of the disclosure only and not limitative to the scope of the disclosure; the scopes of the disclosure are defined by the accompanying claims.

What is claimed is:

1. A display substrate, wherein the display substrate is defined to be an array area and a peripheral area surrounding the array area;
the display substrate comprises a base substrate;
the array area comprises a plurality of light emitting subunits; each of the plurality of light emitting subunits comprises: a first electrode, a second electrode and a light emitting layer which are laminated on a surface of the base substrate; the light emitting layer is between the first electrode and the second electrode; the first electrode is farther away from the base substrate than the light emitting layer; the first electrodes of the plurality of light emitting subunits are electrically connected with each other;
the peripheral area comprises a connecting electrode and a dummy electrode including a first dummy electrode and a second dummy electrode, the connecting electrode is on the surface of the base substrate and at least partially surrounds the array area; the connecting electrode is electrically connected with the first electrodes of the plurality of light emitting subunits;
the display substrate further comprises a light extraction layer on a side of the first electrode and the connecting electrode away from the base substrate; and projections of the first electrodes of the plurality of light emitting subunits and a projection of the connecting electrode on the base substrate are within a projection of the light extraction layer on the base substrate in at least one direction parallel to the surface; and
a pixel definition layer completely covers a surface of the second dummy electrode away from the base substrate;
wherein the second dummy electrode comprises two ring-shaped sub-electrodes, and the pixel definition layer is disposed between the two ring-shaped sub-electrodes of the second dummy electrode, and the pixel definition layer also covers a side surface of the second dummy electrode.

2. The display substrate according to claim 1, wherein
the connecting electrode comprises a first conductive sublayer and a second conductive sublayer, the second conductive sublayer is on a side of the first conductive sublayer away from the base substrate, the second conductive sublayer is at least partially overlapped with the first conductive sublayer in a direction perpendicular to the surface of the base substrate, and the second conductive sublayer is electrically connected to the first conductive sublayer and the first electrode; and
the light extraction layer covers an upper surface of the connecting electrode and the dummy electrode away from the base substrate, and a whole side surface of each of the first conductive sublayer and the second conductive sublayer away from the display area;
the first conductive sublayer is in direct contact with the second conductive sublayer,
the first conductive sublayer and the second electrode are in a same conductive layer, comprise a same material, and are insulated from each other, and
the second conductive sublayer and the first electrode are in a same conductive layer and comprise a same material.

3. The display substrate according to claim 2, wherein
the first electrodes of the plurality of light emitting subunits are integrally connected and serve as at least a part of a first common electrode layer;
the second conductive sublayer and the first common electrode layer are integrally connected;
each of the second conductive sublayer and the first electrode comprises a first sublayer and a second sublayer which are laminated;
the first sublayer comprises aluminum magnesium alloy;
the second sublayer comprises indium zinc oxide; and
the second sublayer is on a side of the first sublayer away from the base substrate.

4. The display substrate according to claim 1, wherein
the first dummy electrode is on the surface of the base substrate and at least partially surrounds the connecting electrode; and
the connecting electrode is between the first dummy electrode and the array area.

5. The display substrate according to claim 4, wherein a projection of the light extraction layer on the base substrate is at least partially overlapped with a projection of the first dummy electrode on the base substrate.

6. The display substrate according to claim 1, wherein the display substrate further comprises a first insulating layer and an intermediate conductive layer,
the first insulating layer is on a side of the second electrode away from the first electrode and comprises a first via hole and a second via hole;
the intermediate conductive layer is on a side of the first insulating layer away from the second electrode and comprises a first conductive part and a second conductive part; and
the second electrode is electrically connected with the first conductive part through the first via hole; and the first electrode is electrically connected with the second conductive part through the connecting electrode and the second via hole.

7. The display substrate according to claim 6, wherein
the base substrate comprises a first circuit and a second circuit;
the display substrate further comprises a second insulating layer on a side of the intermediate conductive layer away from the second electrode;
the second insulating layer is between the intermediate conductive layer and the base substrate;
the second insulating layer comprises a third via hole and a fourth via hole;
the second electrode is electrically connected with the first circuit of the base substrate through the first via hole, the first conductive part and the third via hole; and the first electrode is electrically connected with the second circuit of the base substrate through the connecting electrode, the second via hole, the second conductive part and the fourth via hole, and
the first via hole, the second via hole, the third via hole and the fourth via hole are filled with a conductive material.

8. The display substrate according to claim 2, wherein the second dummy electrode is on the surface of the base substrate and at least partially surrounds the array area; and the second dummy electrode is between the connecting electrode and the array area,
the first electrode and the light emitting layer of the light emitting subunit adjacent to the second dummy electrode extend to be at least partially overlapped with the second dummy electrode in the direction perpendicular to the surface of the base substrate;
the second conductive sublayer extend to be at least partially overlapped with the second dummy electrode in the direction perpendicular to the surface of the base substrate; and the first dummy electrode and the second dummy electrode are arranged on two sides of the connecting electrode, respectively.

9. The display substrate according to claim 8, wherein the peripheral area further comprises a sensor electrode;
the sensor electrode is between the second dummy electrode and the array area on the surface of the base substrate;
the first electrode and the light emitting layer of the light emitting subunit adjacent to the second dummy electrode extend to completely cover the sensor electrode in the direction perpendicular to the surface of the base substrate;
the base substrate comprises a third circuit;
the intermediate conductive layer further comprises a third conductive part; the first insulating layer further comprises a fifth via hole; the second insulating layer further comprises a sixth via hole;
the sensor electrode is electrically connected with the third conductive part through the fourth via hole, and is electrically connected with the third circuit of the base substrate through the fourth via hole, the third conducive part and the fifth via hole; and
the fifth via hole and the sixth via hole are filled with a conductive material.

10. The display substrate according to claim 9, wherein the peripheral area further comprises a third dummy electrode;
the third dummy electrode is on the surface of the base substrate and at least partially surrounds the array area; and the third dummy electrode is between the sensor electrode and the array area, and
the first electrode and the light emitting layer of the light emitting subunit adjacent to the second dummy electrode extend to completely cover the third dummy electrode in the direction perpendicular to the surface of the base substrate.

11. The display substrate according to claim 10, wherein the pixel definition layer is at at least one of following positions:
between the second electrodes of adjacent light emitting subunits;
between the connecting electrode and the first dummy electrode;
between the connecting electrode and the second dummy electrode;
between the second dummy electrode and the sensor electrode;
between the sensor electrode and the third dummy electrode;
between the third dummy electrode and the second electrode of the light emitting subunit adjacent to the third dummy electrode; and
between the second dummy electrode and the light emitting layer of the light emitting subunit adjacent to the second dummy electrode.

12. The display substrate according to claim 10, wherein the first conductive sublayer of the connecting electrode, the first dummy electrode, the second dummy electrode, the sensor electrode, the third dummy electrode, and the second electrode of the light emitting subunit are in a same conductive layer, and
the first dummy electrode, the second dummy electrode and the third dummy electrode are in a floating state.

13. The display substrate according to claim 10, wherein the display substrate further comprises a first encapsulation layer on a side of the light extraction layer away from the base substrate.

14. The display substrate according to claim 13, wherein the display substrate further comprises a color filter layer,
the color filter layer is on a side of the first encapsulation layer away from the base substrate;
the color filter layer comprises: a first color filter part;
the first color filter part is in the array area and is overlapped with at least one light emitting subunit in the direction perpendicular to the surface of the base substrate;
the color filter layer further comprises: a second color filter part; and
the second color filter part is in the peripheral area and is overlapped with at least one of following elements in the direction perpendicular to the surface of the base substrate:
the connecting electrode;
the first dummy electrode;
the second dummy electrode;
the sensor electrode; and
the third dummy electrode.

15. The display substrate according to claim 14, wherein the display substrate further comprises a second encapsulation layer,
the second encapsulation layer is on a side of the color filter layer away from the base substrate,
a projection of the first encapsulation layer on the base substrate is within a projection of the second encapsulation layer on the base substrate, and
an area of the projection of the first encapsulation layer on the base substrate is less than an area of the projection of the second encapsulation layer on the base substrate.

16. The display substrate according to claim 15, further comprising a cover plate,
wherein the cover plate is on a side of the second encapsulation layer of the display substrate away from the base substrate,
the projection of the second encapsulation layer on the base substrate is within a projection of the cover plate on the base substrate, and
the area of the projection of the second encapsulation layer on the base substrate is less than an area of the projection of the cover plate on the base substrate.

17. The display substrate according to claim 1, wherein the second electrode is a reflecting electrode, and
the base substrate is a silicon-base substrate; and the silicon-base substrate comprises a driving circuit configured to drive the plurality of light emitting subunits.

18. An electronic device, comprising a display substrate, wherein the display substrate is defined to be an array area and a peripheral area surrounding the array area;
the display substrate comprises a base substrate;
the array area comprises a plurality of light emitting subunits; each of the plurality of light emitting subunits comprises: a first electrode, a second electrode and a light emitting layer which are laminated on a surface of the base substrate; the light emitting layer is between the first electrode and the second electrode; the first electrode is farther away from the base substrate than the light emitting layer; the first electrodes of the plurality of light emitting subunits are electrically connected with each other;
the peripheral area comprises a connecting electrode and a dummy electrode including a first dummy electrode and a second dummy electrode, the connecting electrode is on the surface of the base substrate and at least partially surrounds the array area; the connecting electrode is electrically connected with the first electrodes of the plurality of light emitting subunits; and the display substrate further comprises a light extraction layer on a side of the first electrode and the connecting electrode away from the base substrate; and projections of the first electrodes of the plurality of light emitting subunits and a projection of the connecting electrode on the base substrate are within a projection of the light extraction layer on the base substrate in at least one direction parallel to the surface; and a pixel definition layer completely covers a surface of the second dummy electrode away from the base substrate;

wherein the second dummy electrode comprises two ring-shaped sub-electrodes, and the pixel definition layer is disposed between the two ring-shaped sub-electrodes of the second dummy electrode, and the pixel definition layer also covers a side surface of the second dummy electrode.

19. A method of manufacturing a display substrate, wherein the display substrate is defined to be an array area and a peripheral area surrounding the array area; the display substrate comprises a base substrate; and the method comprises:

disposing a plurality of light emitting subunits in the array area on a surface of the base substrate, wherein each of the plurality of light emitting subunits comprises: a first electrode, a second electrode and a light emitting layer which are laminated on the surface of the base substrate; the light emitting layer is between the first electrode and the second electrode; the first electrode is farther away from the base substrate than the light emitting layer; the first electrodes of the plurality of light emitting subunits are electrically connected with each other;

disposing a connecting electrode and a dummy electrode including a first dummy electrode and a second dummy electrode in the peripheral area on the surface of the base substrate surrounding the array area, the connecting electrode being electrically connected with the first electrode; and disposing a light extraction layer on a side of the first electrode and the connecting electrode away from the base substrate, so that projections of the first electrode and the connecting electrode on the base substrate are within a projection of the light extraction layer on the base substrate in at least one direction parallel to the surface; and disposing a pixel definition layer completely covering a surface of the second dummy electrode away from the base substrate;

wherein the second dummy electrode comprises two ring-shaped sub-electrodes, and the pixel definition layer is disposed between the two ring-shaped sub-electrodes of the second dummy electrode, and the pixel definition layer also covers a side surface of the second dummy electrode.

* * * * *